United States Patent
Nakamura et al.

(10) Patent No.: US 8,094,692 B2
(45) Date of Patent: Jan. 10, 2012

(54) MODULATION METHOD, MODULATION PROGRAM, RECORDING MEDIUM, MODULATION DEVICE, AND OPTICAL TRANSMITTER

(75) Inventors: Hirotaka Nakamura, Makuhari (JP); Shunji Kimura, Makuhari (JP); Kazutaka Hara, Makuhari (JP); Koji Kitahara, Yokohama (JP)

(73) Assignees: Nippon Telegraph and Telephone Corporation, Tokyo (JP); NTT Electronics Corporation, Kanagawa (JP)

( * ) Notice: Subject to any disclaimer, the term of this patent is extended or adjusted under 35 U.S.C. 154(b) by 0 days.

(21) Appl. No.: 12/867,443

(22) PCT Filed: Feb. 20, 2009

(86) PCT No.: PCT/JP2009/053054
§ 371 (c)(1),
(2), (4) Date: Oct. 18, 2010

(87) PCT Pub. No.: WO2009/104746
PCT Pub. Date: Aug. 27, 2009

(65) Prior Publication Data
US 2011/0033193 A1    Feb. 10, 2011

(30) Foreign Application Priority Data
Feb. 22, 2008  (JP) .................. 2008-042034

(51) Int. Cl.
*H01S 3/10* (2006.01)
*H01S 3/13* (2006.01)
(52) U.S. Cl. ................. 372/26; 372/29.016; 372/29.023

(58) Field of Classification Search .................. 372/26, 372/29.016, 29.023, 38.02
See application file for complete search history.

(56) References Cited

FOREIGN PATENT DOCUMENTS

| | | |
|---|---|---|
| JP | 01-166582 | 6/1989 |
| JP | 04-298088 | 10/1992 |
| JP | 2005-38943 | 2/2005 |
| JP | 2005-302865 | 10/2005 |

OTHER PUBLICATIONS

Shunji Kimura, "High-speed Burst-mode Transmission Technologies," The Institute of Electronics, Information and Communication Engineers (IEICE), Jan. 1, 2008, vol. 91, pp. 60-65.

Yoshida, et al., "First Single-fibre Bi-directional XFP Transceiver for Optical Metro/Access Networks", ECOC, 2005, vol. 3, pp. 543-544.

(Continued)

*Primary Examiner* — Armando Rodriguez
(74) *Attorney, Agent, or Firm* — Ohlandt, Greeley, Ruggiero & Perle, L.L.P.

(57) ABSTRACT

A modulation method according to the invention is applied to a modulation device in which a light source is driven by a differential signal while a modulation circuit and the light source are capacitively coupled. In the modulation method of the invention, when an average potential fluctuates at an input terminal of the light source, a potential fluctuation is externally provided using a control circuit such that a normal phase side and a reverse phase side become equal to each other in a time constant of the fluctuation in average potential, and transient states of the average potentials at the normal phase side and reverse phase side are equalized and cancel each other as in-phase components of a signal input to the light source, which allows an optical signal to be normally transmitted from the light source. The optical signal can normally be transmitted from the light source even before the average potentials at a normal phase input terminal and a reverse phase input terminal of the light source are stabilized.

25 Claims, 28 Drawing Sheets

OTHER PUBLICATIONS

International Search Report dated Apr. 14, 2009 for corresponding International Application No. PCT/JP2009/053054.
English translation of Written Opinion of International Searching Authority for corresponding International Patent Application No. PCT/JP2009/053054 (non-English Written Opinion of International Searhing Authority previously submitted on Aug. 12, 2010).
Partial English translation of "High-speed Burst-mode Transmission Technologies," by Shunji Kimura (non-English version of article previously submitted on Aug. 12, 2010).

FIG. 4

MODULATION METHOD, MODULATION PROGRAM, RECORDING MEDIUM, MODULATION DEVICE, AND OPTICAL TRANSMITTER

TECHNICAL FIELD

The present invention relates to a modulation method when a modulation circuit and a modulation target that is a direct modulation laser or an external optical modulator are capacitively coupled, a modulation device that performs modulation by the modulation method, and an optical transmitter provided with the modulation device.

BACKGROUND ART

Currently, a demand for an economical high-speed access network is increased with spread of the Internet, and plural users temporally multiplex an optical line such as GE-PON having a line rate of 1 Gbit/s, thereby introducing an optical access system that realizes economic efficiency. Currently, technical development of the line rate of 10 Gbit/s advances for the purpose of further speed enhancement. In the optical access system such as PON that temporally multiplexes the plural users, an upload signal from an ONU (Optical Network Unit) that is a device in a user's home to an OLT (Optical Line Terminal) that is a station device in a building of a communication carrier becomes an intermittent burst signal. Accordingly, it is necessary that the optical transmitter in the ONU stops optical output while another ONU performs the transmission, and has functions of instantaneously stopping output of a stable optical signal and resuming the output.

FIG. 1 is a circuit diagram of a conventional GE-PON burst signal sending optical transmitter which has the functions. (for example, see Non-Patent Document 1). An LD (Laser Diode) 420 is DC-coupled to an LDD (Laser Diode Driver) 21 of a modulation circuit 11, and outputs an optical transmitting signal modulated by the LDD 21. At this point, because the LD 420 stops the output during the time another ONU performs the transmission, the LD 420 has a configuration in which an electric signal input to the LDD 21 and a bias current passed through the LD 420 are stopped according to the input of a Tx_disable signal. In the description, that the output of the optical signal is stopped by the Tx_disable signal while the optical signal is transmitted by a Tx_enable signal is described as "the signal is intermittently transmitted". At this point, from the standpoint of the economic realization of the speed enhancement of the line rate like 10GE-PON, it is necessary to adopt a differential electric signal similarly to a continuous signal transmitting and receiving system in order to suppress an electric crosstalk of the transmitting and receiving system (for example, see Non-Patent Document 2).

Non-Patent Document 1: Shunji Kimura, "High-speed burst technology", IEICE transaction, Vol. 91 No. 1, pp. 60-65 January 2008

Non-Patent Document 2: T. Yoshida et. al., "First Single-fibre Bi-directional XFP Transceiver for Optical Metro/Access Networks", ECOC 2005, We 4. P. 021, 2005.

DISCLOSURE OF THE INVENTION

Problem to be Solved by the Invention

When the differential electric signal is used, desirably the LDD and the LD are capacitively coupled because the DC coupling of the LDD and the LD needs large modulation signal amplitude. However, for the capacitive coupling, when the LDD intermittently outputs a output electric signal, an average potential temporally largely fluctuates depending on a time constant at each terminal. Therefore, a transient state fluctuation is generated in the optical signal output from the LD, it is difficult to normally output the optical signal.

FIG. 2 is a block diagram of a modulation device 401 that capacitively couples the LDD and the LD and is driven by a differential electric signal. FIG. 3 is a view illustrating a potential fluctuation at each of capacitively-coupled terminals (normal phase output terminal 25a, reverse phase output terminal 25b, normal phase input terminal 35a, and reverse phase input terminal 35b) in the modulation device 401 of FIG. 2. The output of the general LDD is generated by a current source. However, for the sake of convenience of explanation, it is assumed that the output of the LDD is generated by a constant voltage source. It is assumed that the normal phase side terminal 25a and reverse phase side terminal 25b of the LDD 21 are in the state of the Tx_disable for the time another ONU outputs the optical signal, and have potentials $V_{low}$ and $V_{high}$, respectively. The electric signal having amplitude $V_{p-p}$ is intermittently output for the time of the Tx_enable the optical signal is output. Accordingly, the average potential on the LDD side rises by an average potential fluctuation $|\Delta V_{DP}|(=V_{p-p}/2)$ from $V_{low}$ at the normal phase output terminal 25a, and declines by $|\Delta V_{DN}|(=V_{p-p}/2)$ from $V_{high}$ at the reverse phase output terminal 25b. The normal phase input terminal 35a that is an anode side of the LD and the reverse phase input terminal 35b that is a cathode side retain a potential Va such that a bias current is not passed through the LD for the time (Tx_disable) another ONU outputs the optical signal. During a state transition from the Tx_disable to the Tx_enable, at the normal phase input terminal 35a, after the average potential rises by $|\Delta V_{DP}|$, that is, a potential amount equal to $V_{p-p}/2$, the average potential declines to Va. Accordingly, at the normal phase input terminal 35a, a potential fluctuation $|\Delta V_{LP}|$ is $V_{p-p}/2$ in the transient state. At the reverse phase input terminal 35b, the average potential is lowered to Vc because the bias current is passed through the LD. Accordingly, at the reverse phase input terminal 35b, a potential fluctuation $|\Delta V_{LN}|$ becomes equal to Va−Vc−$V_{p-p}/2$ in the transient state.

In the optical transmitter in which the LD is driven by the differential electric signal while the LDD and the LD are capacitively coupled, the normal phase side and the reverse phase side differ from each other in the average potential fluctuation applied to the LD in the transient state from the Tx_disable to the Tx_enable, and the average potential fluctuations on the normal phase side and the reverse phase side become different transient states. Therefore, in the optical signal output from the LD, a waveform deformation is generated to hardly transmit the normal optical signal until the average potential fluctuation is stabilized.

In view of the foregoing, an object of the invention is to provide a modulation method, a modulation program, a recording medium, a modulation device, and an optical transmitter, in which the optical signal can normally be transmitted from the light source even before the average potentials at the normal phase input terminal and reverse phase input terminal of the light source are stabilized when the light source is driven by the differential signal while the modulation circuit and the light source are capacitively coupled.

Means for Solving Problem

To achieve the object, in a modulation method according to the invention, when an average potential fluctuates at an input terminal of a light source, a control circuit externally provides a potential fluctuation such that a normal phase side and a reverse phase side are equal to each other in a time constant of an average potential fluctuation, the normal phase side and the reverse phase side are equalized in a transient state of the average potential, and the average potentials cancel each other as in-phase components of the signal input to the light source, which allows an optical signal to be transmitted normally from the light source.

Specifically, a modulation method according to the present invention in a modulation device including a modulation circuit that passes a bias current through a modulation target that is a direct modulation laser or an external optical modulator, the modulation target being capacitively coupled to the modulation circuit, the modulation circuit driving the modulation target with a differential electric signal including a normal phase and a reverse phase; and a control circuit that sends a control signal to the modulation circuit to control the modulation circuit based on a signal providing an instruction to permit or prohibit transmission, is characterized in that, when fluctuations in average potentials at a normal phase input terminal and a reverse phase input terminal of the modulation target are generated, the control circuit causes the modulation circuit to control at least one of average potentials at the normal phase input terminal and the reverse phase input terminal and the normal phase output terminal and the reverse phase output terminal of the modulation circuit such that transient states of the average potentials generated before and after average potential fluctuation become identical to each other, and the transient state of the average potential at the normal phase input terminal and the transient state of the average potential at the reverse phase input terminal cancel each other as in-phase components of the differential electric signal.

When the average potential at the normal phase input terminal and the average potential at the reverse phase input terminal of the modulation target fluctuate, the control circuit causes the modulation circuit to control at least one of the average potentials at the normal phase input terminal and reverse phase input terminal and the normal phase output terminal and reverse phase output terminal of the modulation circuit such that transient states of the average potential generated before and after the average potential fluctuation are equalized to each other. Because the average potential at the normal phase input terminal and the average potential at the reverse phase input terminal transition similarly by the control, a difference between the average potential at the normal phase input terminal and the average potential at the reverse phase input terminal is kept constant even in the transient state. That is, the transient states of the average potential at the normal phase input terminal and the average potential at the reverse phase input terminal can cancel each other as the in-phase components of the differential electric signal.

Accordingly, in the modulation method according to the invention, when the light source is driven by the differential signal while the modulation circuit and the light source are capacitively coupled, the optical signal can normally be transmitted from the light source even before the average potential at the normal phase input terminal and the average potential at the reverse phase input terminal of the light source are stabilized.

In the modulation method according to the present invention, the control circuit can control the modulation circuit such that the average potential at the reverse phase input terminal is lowered by an amplitude voltage of a modulation signal with a time constant that is identical to a time constant in the transient state of the average potential at the normal phase input terminal.

In the modulation method according to the present invention, the control circuit can control the modulation circuit, such that the average potential at the reverse phase input terminal is lowered with a time constant that is identical to a time constant in the transient state of the average potential at the normal phase input terminal, and such that a difference potential amount, in which an amplitude voltage of a modulation signal is subtracted from a difference between the average potential at the normal phase input terminal and the average potential at the reverse phase input terminal after the transient state, is previously changed in the average potential at the reverse phase input terminal before the average potential at the normal phase input terminal and the average potential at the reverse phase input terminal fluctuate.

In the modulation method according to the present invention, the control circuit can control the modulation circuit, such that the average potential at the reverse phase input terminal is lowered with a time constant that is identical to a time constant in the transient state of the average potential at the normal phase input terminal, and such that a difference potential amount, in which an amplitude voltage of a modulation signal is subtracted from a difference between the average potential at the normal phase input terminal and the average potential at the reverse phase input terminal after the transient state, is previously changed in the average potential at the normal phase output terminal before the average potential at the normal phase input terminal and the average potential at the reverse phase input terminal fluctuate.

In the modulation method according to the present invention, the control circuit can control the modulation circuit such that the average potential at the normal phase input terminal is raised by an amplitude voltage of a modulation signal with a time constant that is identical to a time constant in the transient state of the average potential at the reverse phase input terminal.

In the modulation method according to the present invention, the control circuit can control the modulation circuit, such that the average potential at the normal phase output terminal is raised with a time constant that is identical to a time constant in the transient state of the average potential at the reverse phase input terminal, and such that a difference potential amount, in which an amplitude voltage of a modulation signal is subtracted from a difference between the average potential at the normal phase input terminal and the average potential at the reverse phase input terminal after the transient state, is previously changed in the average potential at the normal phase output terminal before the average potential at the normal phase input terminal and the average potential at the reverse phase input terminal fluctuate.

In the modulation method according to the present invention, the control circuit can control the modulation circuit, such that the average potential at the normal phase output terminal is raised with a time constant that is identical to a time constant in the transient state of the average potential at the reverse phase input terminal, and such that a difference potential amount, in which an amplitude voltage of a modulation signal is subtracted from a difference between the average potential at the normal phase input terminal and the average potential at the reverse phase input terminal after the transient state, is previously changed in the average potential at the reverse phase input terminal before the average potential at the normal phase input terminal and the average potential at the reverse phase input terminal fluctuate.

In the modulation method according to the present invention, it is preferable that optical power of an optical signal output from the modulation target is measured, and feedback control adjusting at least one of the average potentials at the normal phase input terminal and the reverse phase input terminal and the normal phase output terminal and the reverse phase output terminal of the modulation circuit is performed such that the optical power becomes a predetermined value. In the modulation method according to the invention, even if the aging of the modulation target is generated, the driving current and bias current that are used to drive the modulation target can follow the aging of the modulation target.

In the modulation method, it is preferable that the feedback control is performed only in a signal providing an instruction to permit the transmission in the signal providing the instruction to permit or prohibit the transmission. The optical power is zero for the time the optical signal is not output. Therefore, in the modulation method according to the invention, the time the optical signal is not output is excluded from the computation in performing the feedback control, and accuracy of the feedback control is improved.

In the modulation method according to the present invention, it is preferable that a temperature of the modulation target is measured, and feedforward control adjusting at least one of the average potentials at the normal phase input terminal and the reverse phase input terminal and the normal phase output terminal and the reverse phase output terminal of the modulation circuit is performed such that intensity of the optical signal output from the modulation target becomes a predetermined value even if the temperature of the modulation target fluctuates. In the modulation method according to the invention, even if the temperature of the outdoor air or the target modulation fluctuates, the driving current and bias current that are used to drive the modulation target can follow the temperature fluctuation of the outdoor air or the modulation target.

A modulation device according to the present invention includes: a modulation circuit that passes a bias current through a modulation target that is a direct modulation laser or an external optical modulator, the modulation target being capacitively coupled to the modulation circuit, the modulation circuit driving the modulation target with a differential electric signal including a normal phase and a reverse phase; and a control circuit that sends a control signal to the modulation circuit to control the modulation circuit based on a signal providing an instruction to permit or prohibit transmission, the modulation device is characterized in that the control circuit causes the modulation circuit to control at least one of average potentials at a normal phase input terminal and a reverse phase input terminal of the modulation target and average potentials at a normal phase output terminal and a reverse phase output terminal of the modulation circuit by the modulation method.

The modulation device includes the control circuit, and the control circuit causes the modulation circuit to modulate the input signal like the modulation method. Therefore, even if the average potential at the normal phase input terminal and the average potential at the reverse phase input terminal of the modulation target fluctuate, the transient states of the average potential at the normal phase input terminal and the average potential at the reverse phase input terminal of the modulation target can cancel each other as the in-phase components of the differential electric signal.

Accordingly, in the modulation device according to the invention, when the light source is driven by the differential signal while the modulation circuit and the light source are capacitively coupled, the optical signal can normally be transmitted from the light source even before the average potential at the normal phase input terminal and the average potential at the reverse phase input terminal of the light source are stabilized.

A modulation device according to the present invention includes: a modulation circuit that passes a bias current through a modulation target that is a direct modulation laser or an external optical modulator, the modulation target being capacitively coupled to the modulation circuit, the modulation circuit driving the modulation target with a differential electric signal including a normal phase and a reverse phase; a control circuit that sends a control signal to the modulation circuit to control the modulation circuit based on a signal providing an instruction to permit or prohibit transmission; a current source circuit that is connected to a normal phase output terminal and a reverse phase output terminal of the modulation circuit; and a current controller that controls a current value of the current source circuit, and the control circuit may cause the modulation circuit to control at least one of average potentials at a normal phase input terminal and a reverse phase input terminal of the modulation target and average potentials at the normal phase output terminal and the reverse phase output terminal of the modulation circuit by the modulation method, and the control circuit may cause the current controller to control the current value of the current source circuit such that the average potential at the normal phase output terminal or the reverse phase output terminal is changed by the difference potential amount.

A modulation device according to the present invention includes: a modulation circuit that passes a bias current through a modulation target that is a direct modulation laser or an external optical modulator, the modulation target being capacitively coupled to the modulation circuit, the modulation circuit driving the modulation target with a differential electric signal including a normal phase and a reverse phase; a control circuit that sends a control signal to the modulation circuit to control the modulation circuit based on a signal providing an instruction to permit or prohibit transmission; a voltage source circuit that is connected between a ground and at least one of a normal phase output terminal and a reverse phase output terminal of the control circuit, and is a circuit in which two voltage sources and a switch are series-connected, the switch selecting one of the voltage sources; and a voltage controller that controls a voltage value of the voltage source circuit, and the control circuit may cause the modulation circuit to control at least one of average potentials at a normal phase input terminal and a reverse phase input terminal of the modulation target and average potentials at the normal phase output terminal and the reverse phase output terminal of the modulation circuit by the modulation method, and the control circuit may cause the voltage controller to control the voltage value of the voltage source circuit such that the average potential at the normal phase output terminal or the reverse phase output terminal is changed by the difference potential amount.

The modulation device includes the voltage source circuit and the voltage controller, and the control circuit controls the voltage source circuit and the voltage controller. Therefore, in the average potential at the normal phase output terminal or reverse phase output terminal, the difference potential amount in which the amplitude voltage of the modulation signal is subtracted from the difference between the average potential at the normal phase input terminal and the average potential at the reverse phase input terminal after the transient state can previously be changed before the average potential at the normal phase input terminal and the average potential at the reverse phase input terminal fluctuate.

A modulation device according to the present invention includes: a modulation circuit that passes a bias current through a modulation target that is a direct modulation laser or an external optical modulator, the modulation target being capacitively coupled to the modulation circuit, the modulation circuit driving the modulation target with a differential electric signal including a normal phase and a reverse phase; a control circuit that sends a control signal to the modulation circuit to control the modulation circuit based on a signal providing an instruction to permit or prohibit transmission; a current source circuit that is connected to a normal phase output terminal and a reverse phase output terminal of the modulation circuit; and a current controller that controls a current value of the current source circuit, and the modulation circuit includes a Darlington connection type differential pair, a pair of the normal phase output terminal and the reverse phase output terminal of the modulation circuit is the Darlington connection type differential pair, the control circuit may cause the modulation circuit to control at least one of average potentials at a normal phase input terminal and a reverse phase input terminal of the modulation target and average potentials at the normal phase output terminal and the reverse phase output terminal of the modulation circuit by the modulation method, and the control circuit may cause the current controller to control the current value of the current source circuit such that the average potential at the normal phase output terminal or the reverse phase output terminal is changed by the difference potential amount.

The driving current used to drive the modulation target can be reduced.

The modulation device according to the preset invention may further include an integration circuit between at least one of the normal phase input terminal and the reverse phase input terminal and LD bias circuit. The time constant in the transient state at the normal phase input terminal and the time constant in the transient state at the reverse phase input terminal can be matched with each other by providing the integration circuit.

It is preferable that the modulation device according to the present invention further includes an optical monitor means for measuring optical power of an optical signal output from the modulation target, and that the control circuit performs feedback control adjusting at least one of the average potentials at the normal phase input terminal and the reverse phase input terminal and the normal phase output terminal and the reverse phase output terminal of the modulation circuit such that the optical power measured by the optical monitor means becomes a predetermined value. In the modulation device according to the invention, the driving current and bias current that are used to drive the modulation target can follow the aging of the modulation target.

In the modulation device, it is preferable that the control circuit performs the feedback control only in a signal providing an instruction to permit the transmission in the signal providing the instruction to permit or prohibit the transmission. The optical power is zero for the time the optical signal is not output. Therefore, in the modulation device according to the invention, the time the optical signal is not output is excluded from the computation in performing the feedback control, and accuracy of the feedback control is improved.

The optical monitor means may be a photoreceiver that is disposed in a direction in which the modulation target outputs the optical signal. The modulation device includes the photoreceiver outside the modulation target, so that the modulation target can be miniaturized.

It is preferable that the modulation device according to the present invention further includes a temperature sensor that measures a temperature of the modulation target, and that the control circuit performs feedforward control adjusting at least one of the average potentials at the normal phase input terminal and the reverse phase input terminal and the normal phase output terminal and the reverse phase output terminal of the modulation circuit such that intensity of the optical signal output from the modulation target becomes a predetermined value even if the modulation target temperature measured by the temperature sensor fluctuates. In the modulation device according to the invention, the driving current and bias current that are used to drive the modulation target can follow the temperature fluctuation of the outdoor air or the modulation target.

The optical transmitter according to the invention includes the modulation device and the modulation target. Even if the average potential at the normal phase input terminal and the average potential at the reverse phase input terminal of the modulation target fluctuate, the transient states of the average potential at the normal phase input terminal and the average potential at the reverse phase input terminal of the modulation target can cancel each other as the in-phase components of the differential electric signal by providing the modulation device.

Accordingly, in the optical transmitter according to the invention, when the light source is driven by the differential signal while the modulation circuit and the light source are capacitively coupled, the optical signal can normally be transmitted from the light source even before the average potential at the normal phase input terminal and the average potential at the reverse phase input terminal of the light source are stabilized.

The modulation program according to the invention can cause the computer to perform the modulation method. The optical transmitter is connected to the computer, and the control circuit controls the modulation circuit such that the modulation method is performed in the response to the instruction from the computer that reads the modulation program. Preferably the modulation program is recorded in the computer-readable recording medium.

Accordingly, in the modulation program and recording medium according to the invention, when the light source is driven by the differential signal while the modulation circuit and the light source are capacitively coupled, the optical signal can normally be transmitted from the light source even before the average potential at the normal phase input terminal and the average potential at the reverse phase input terminal of the light source are stabilized.

Effect of the Invention

The invention can provide the modulation method, the modulation program, the recording medium, the modulation device, and the optical transmitter, in which the optical signal can normally be transmitted from the light source even before the average potentials at the normal phase input terminal and reverse phase input terminal of the light source are stabilized when the light source is driven by the differential signal while the modulation circuit and the light source are capacitively coupled.

BRIEF DESCRIPTION OF THE DRAWINGS

FIG. 4 is a view illustrating a potential state at each terminal in a modulation device of an optical transmitter according to the invention.

EXPLANATION OF REFERENCE NUMERALS

Figure 1:
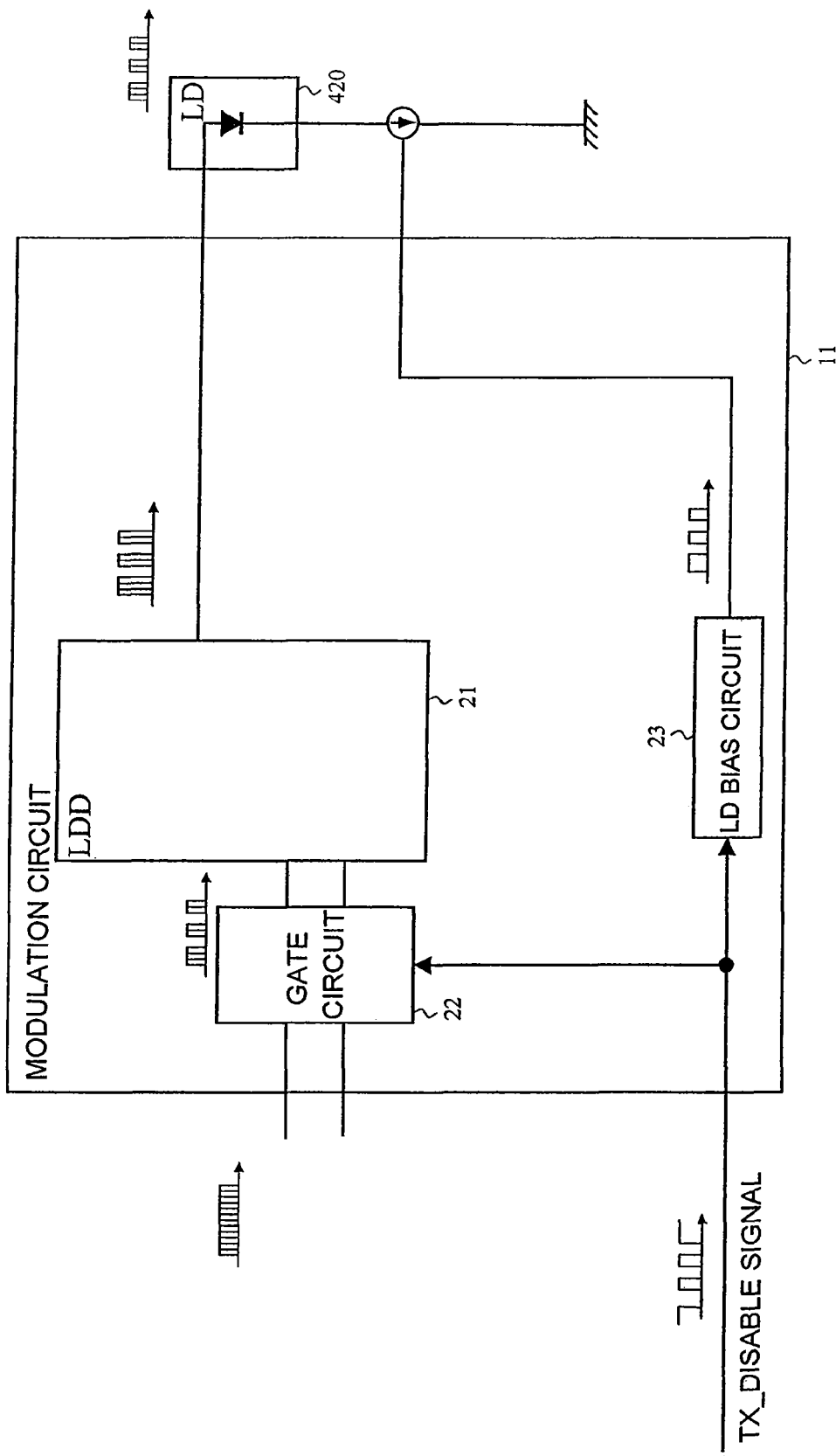
FIG. 1 is a circuit diagram of a conventional GE-PON burst signal sending optical transmitter.
Figure 2:
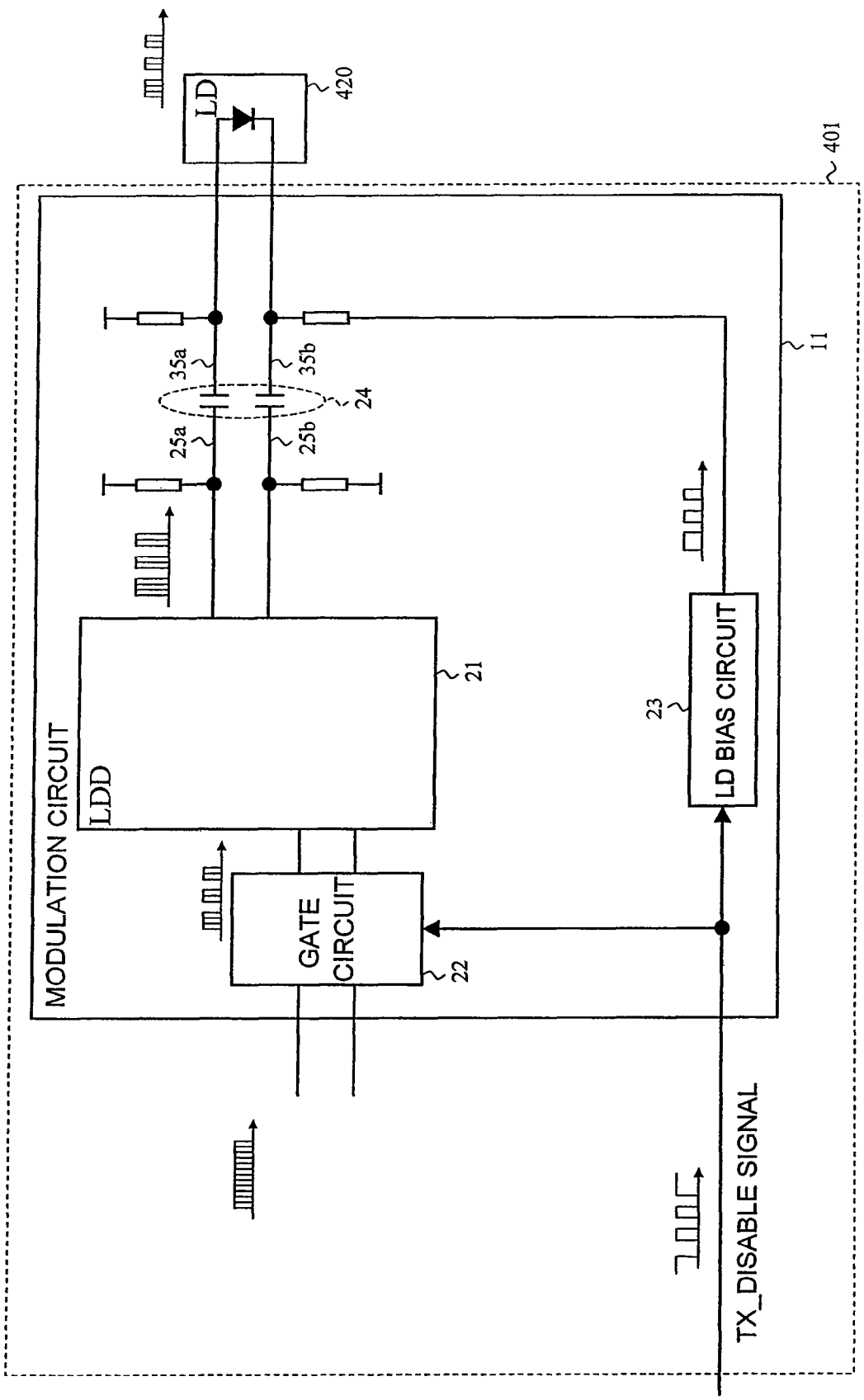
FIG. 2 is a block diagram of a conventional optical transmitter.
Figure 3:
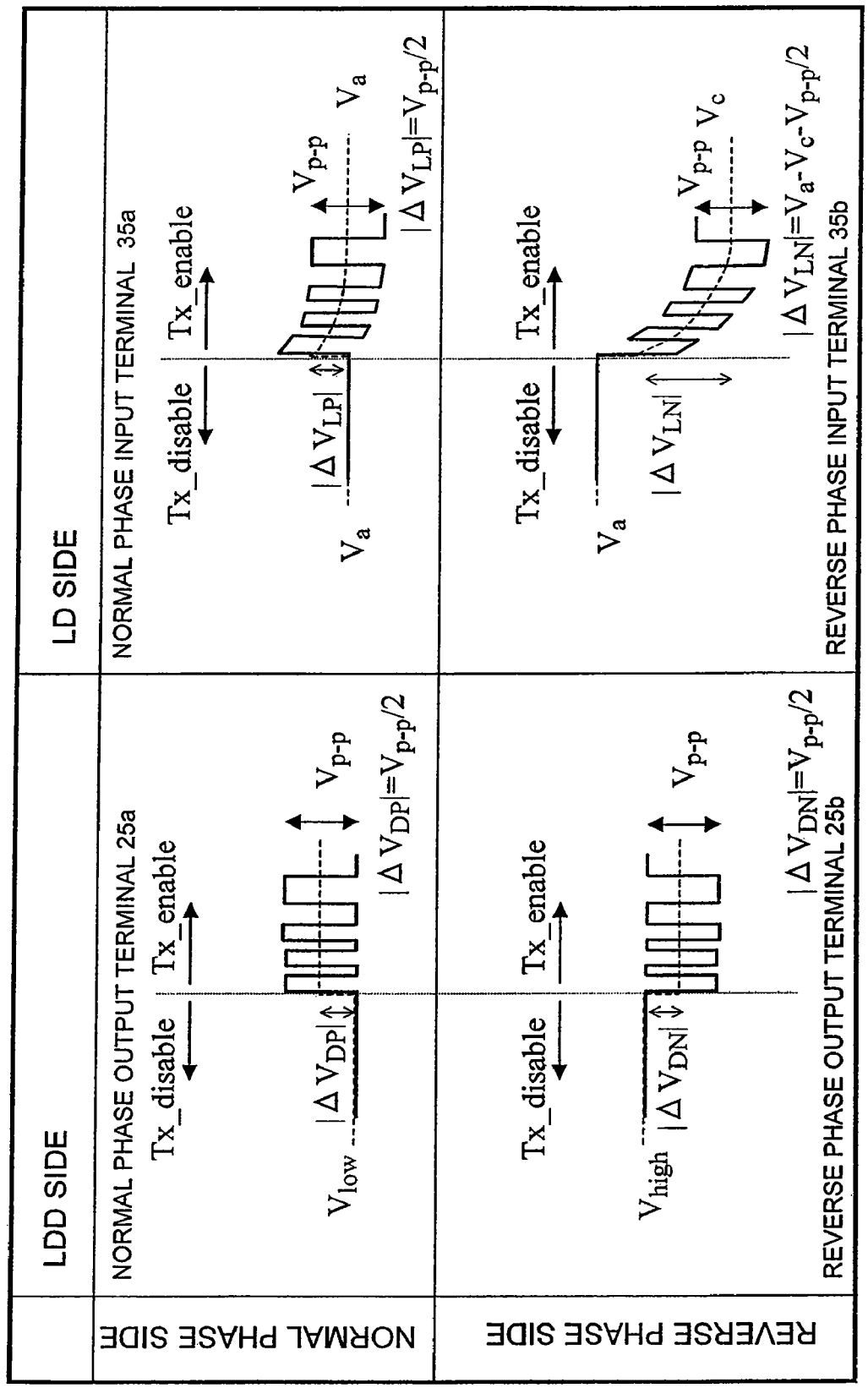
FIG. 3 is a view illustrating a potential fluctuation at each of capacitively-coupled terminals in a conventional optical transmitting device.

Reference numerals used in the drawings are explained as follows:
301 to 306 and 401: modulation device
320 and 420: LD (Laser Diode)
11, 11-1, 11-2, 11-4, and 11-5: modulation circuit
12: control circuit
13: voltage source circuit
14: voltage controller
21: LDD (Laser Diode Driver)
21j: current source circuit
22: gate circuit
23: LD bias circuit
24: capacitance
25a: normal phase output terminal
25b: reverse phase output terminal
27: integration circuit
29: resistor
31: switch (SW)
32 and 34: voltage source
33: SW control unit
35a: normal phase input terminal
35b: reverse phase input terminal
41: photoreceiver
42: temperature sensor
90: recording medium
111: storage medium reading device
112: work memory
113: memory
114: display
115: mouse
116: keyboard
117: CPU
118: hard disk
119: cable
300: computer

BEST MODES FOR CARRYING OUT THE INVENTION

Embodiments of the invention will be described with reference to the accompanying drawings. The following embodiments are examples of a configuration of the invention, and the invention is not limited to the embodiments. The same component is denoted by the same numeral in the description and the drawings.

First Embodiment

Figure 5:
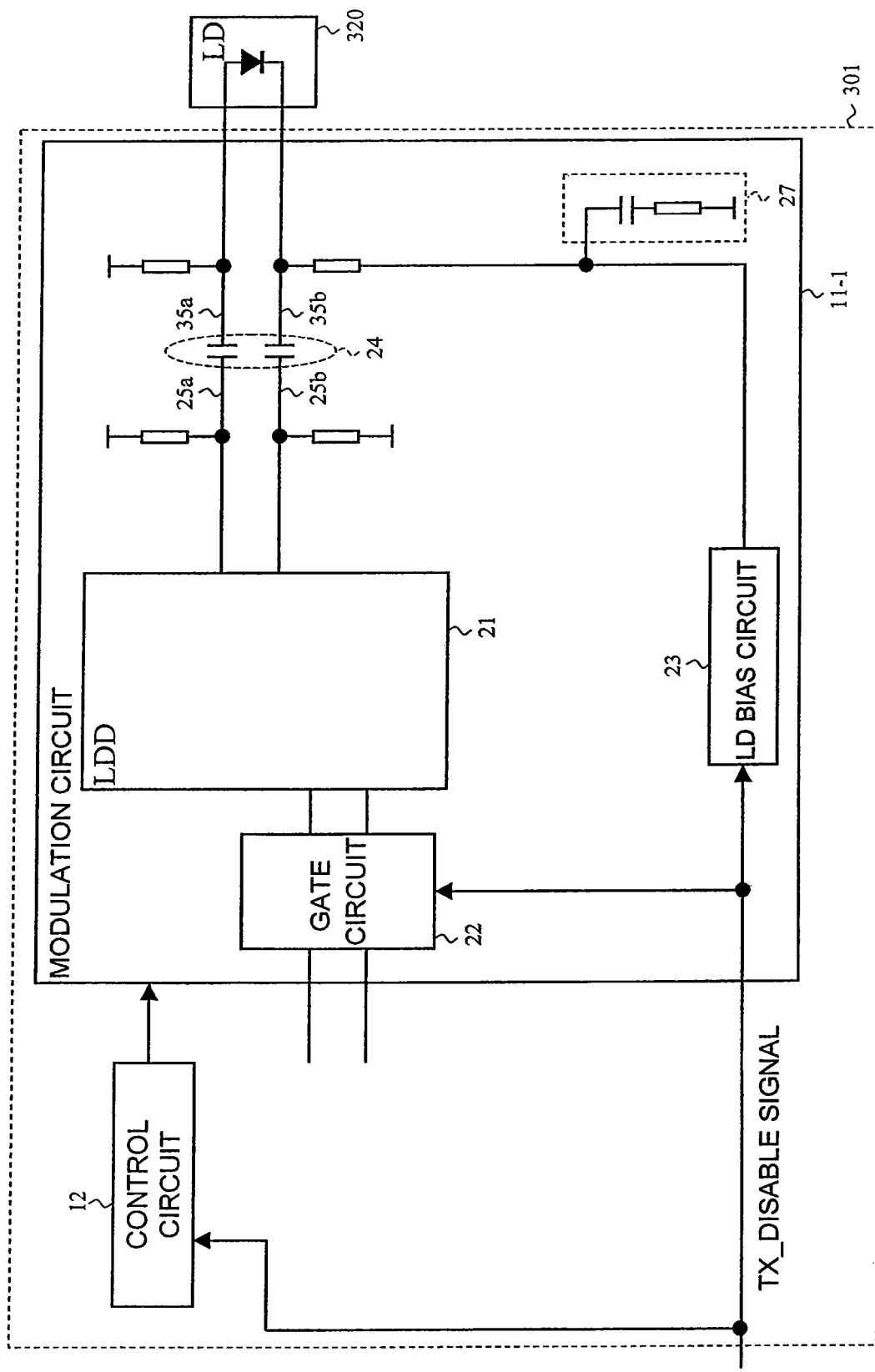
FIG. 5 is a block diagram explaining a configuration of an optical transmitter according to the invention.

FIG. 5 illustrates a block diagram explaining a configuration of an optical transmitter according to a first embodiment. The optical transmitter of FIG. 5 includes a modulation device 301 and an LD 320 that is a modulation target. For example, the LD 320 is a direct modulation laser diode. The modulation device 301 includes a control circuit 12 and a modulation circuit 11-1. The modulation circuit 11-1 includes an LDD 21, an LD bias circuit 23, a gate circuit 22, and an integration circuit 27.

The gate circuit 22 passes or cuts off an input signal based on an external Tx_enable signal or an external Tx_disable signal, which is a signal providing an instruction to permit or prohibit transmission. The input signal passed through the gate circuit 22 is input to the LDD 21. The LDD 21 amplifies and outputs the input signal such that the LD 320 can be driven. The LDD 21 includes a normal phase output terminal 25a that is a normal phase side of the input signal and a reverse phase output terminal 25b that is a reverse phase side.

The normal phase output terminal 25a and the reverse phase output terminal 25b are connected to a normal phase input terminal 35a and a reverse phase input terminal 35b through capacitances 24, respectively. The normal phase input terminal 35a and the reverse phase input terminal 35b are connected to the LD 320. That is, the LDD 21 and the LD 320 are capacitive-coupled to each other. Each terminal is connected to a power supply through an inductor in order to control potentials at the normal phase output terminal 25a, the reverse phase output terminal 25b, the normal phase input terminal 35a, and the reverse phase input terminal 35b using current.

The LD bias circuit 23 is connected to the reverse phase input terminal 35b. The LD bias circuit 23 supplies the current to the reverse phase input terminal 35b based on the external Tx_enable signal or Tx_disable signal. The LD bias circuit 23 changes the potential at the reverse phase input terminal 35b using the current, and adjusts a potential difference between the normal phase input terminal 35a and the reverse phase input terminal 35b, which allows bias current to be passed through the LD 320.

For example, the integration circuit 27 is a Low-Pass Filter (LPF). The integration circuit 27 is connected between the LD bias circuit 23 and the reverse phase input terminal of the LD. Occasionally average potentials at the normal phase output terminal 25a and reverse phase output terminal 25b fluctuate rapidly by a differential electric signal output from the normal phase output terminal 25a and reverse phase output terminal 25b. The average potentials at the normal phase input terminal 35a and reverse phase input terminal 35b fluctuate with a certain time constant according to the fluctuations in average potentials at the normal phase output terminal 25a and reverse phase output terminal 25b. The time constant of the normal phase input terminal 35a and the time constant of the reverse phase input terminal 35b can be matched by adjusting the integration circuit 27.

The modulation circuit 11-1 passes the bias current through the capacitively-coupled LD 320 to drive the LD 320 using the differential electric signal including a normal phase and a reverse phase. The control circuit 12 is connected to the modulation circuit 11-1. The control circuit 12 sends a control signal to the modulation circuit 11-1 to control the modulation circuit 11-1 based on the Tx_enable signal or Tx_disable signal. Specifically, the control circuit 12 controls at least one of the average potentials at the normal phase input terminal 35a and reverse phase input terminal 35b of the LD 320 and the average potentials at the normal phase output terminal 25a and reverse phase output terminal 25b of the modulation circuit 11-1 such that the below-described modulation method is adopted to the modulation circuit 11-1.

The modulation method of the modulation device 301 is characterized in that, when the fluctuations in average potentials at the normal phase input terminal 35a and the reverse phase input terminal 35b are generated, the control circuit 12 causes the modulation circuit 11-1 to control at least one of the average potentials at the normal phase input terminal 35a and reverse phase input terminal 35b and the normal phase output terminal 25a and reverse phase output terminal 25b of the LDD 21 such that transient states of the average potentials generated before and after the average potential fluctuation become identical to each other, and the transient state of the average potential at the normal phase input terminal 35a and the transient state of the average potential at the reverse phase input terminal 35b cancel each other as in-phase components of the differential electric signal output from the LDD 21.

In the first embodiment, the control circuit 12 controls the modulation circuit 11-1 such that the average potential at the reverse phase input terminal 35b is lowered by an amplitude voltage of a modulation signal with the same time constant as that in the transient state of the average potential at the normal phase input terminal 35a.

Figure 4:
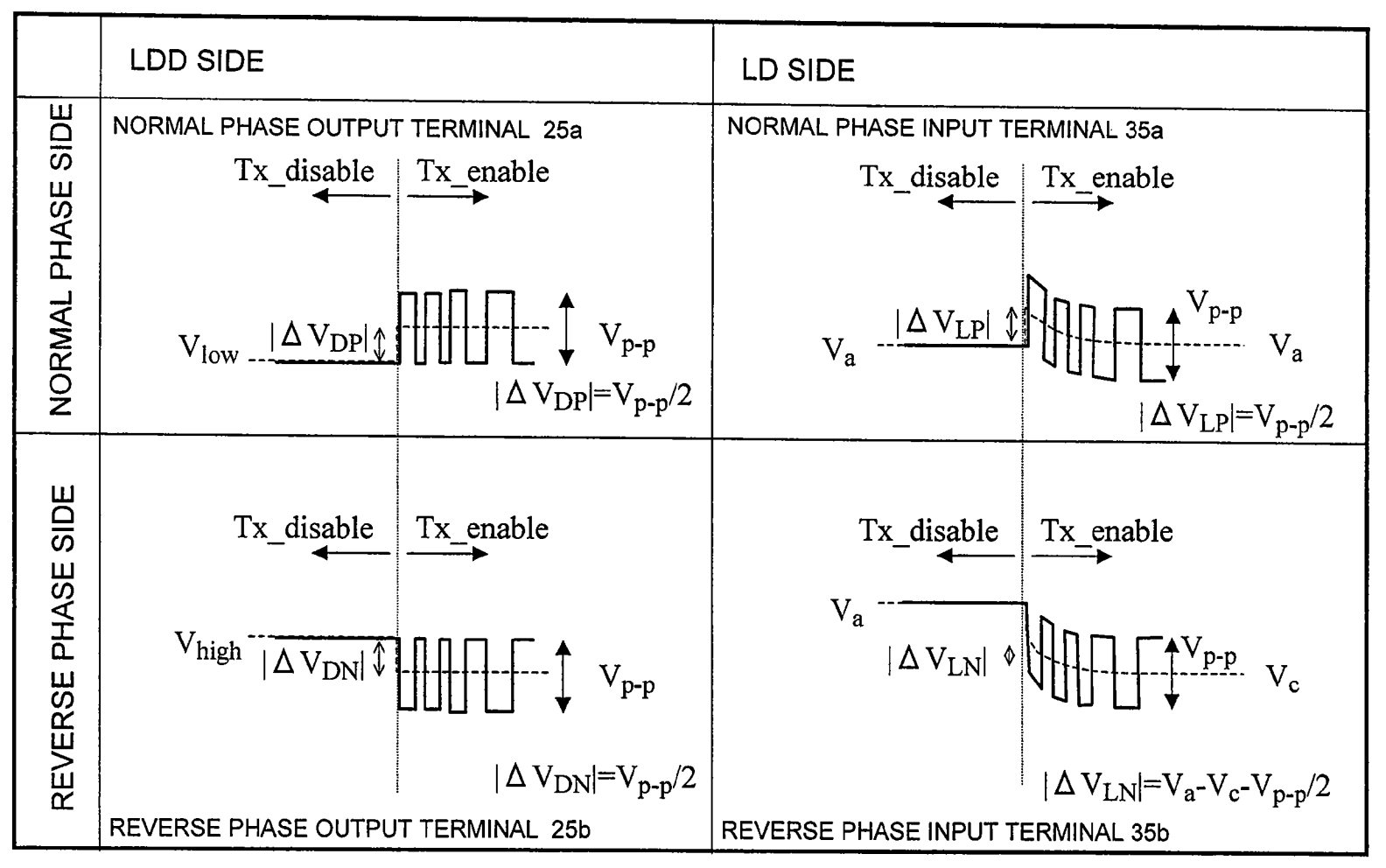

FIG. 4 illustrates a potential state at each terminal in the modulation device of the first embodiment. The potential fluctuation at each terminal is indicated by a solid line and the average potential is indicated by a broken line.

At the normal phase output terminal 25a, a potential $V_{low}$ is retained during the Tx_disable, and a modulation signal having amplitude $V_{p-p}$ is output during the Tx_enable. An average potential fluctuation $|\Delta V_{DP}|$ becomes $V_{p-p}/2$ in the change in state from the Tx_disable to the Tx_enable. On the other hand, at the reverse phase output terminal 25b, a potential $V_{high}$ is retained during the Tx_disable, and the modulation signal having the amplitude $V_{p-p}$ is output during the Tx_enable. An average potential fluctuation $|\Delta V_{DN}|$ becomes $V_{p-p}/2$ in the change in state from the Tx_disable to the Tx_enable.

At this point, at the normal phase input terminal 35a, a potential Va is retained during the Tx_disable, and the modulation signal having the amplitude $V_{p-p}$ is input during the Tx_enable. Because the LDD and the LD are capacitively coupled in the change in state from the Tx_disable to the Tx_enable, after the average potential rises to $V_{p-p}/2$, the average potential declines to Va with a certain time constant, and the modulation signal having the average potential Va and the amplitude $V_{p-p}$ is then input to the LD. At this point, a fluctuation potential amount $|\Delta V_{LP}|$ of a transient response is $V_{p-p}/2$ that is equal to $|\Delta V_{DP}|$.

At the reverse phase input terminal 35b, the potential Va is retained during the Tx_disable, and the average potential is lowered to Vc (=Va−$V_{p-p}$), at which a fluctuation potential amount of the average potential becomes double the fluctuation potential amount $V_{p-p}/2$ at the normal phase input terminal 35a, so as to pass the bias current through the LD at the same time as the modulation signal having the amplitude $V_{p-p}$ is input during the Tx_enable. Because the LDD and the LD are capacitively coupled in the change in state from the Tx_disable to the Tx_enable, the average potential declines to $V_{p-p}/2$, and to Vc with the same time constant as that at the normal phase input terminal 35a in order to pass the bias current, and the modulation signal having the average potential Vc and the amplitude $V_{p-p}$ is then input to the LD. The time constant at the reverse phase input terminal 35b is adjusted to the same time constant as that at the normal phase input terminal 35a by changing the time constant of the integration circuit 27. The integration circuit 27 is eliminated when the need to adjust the time constant does not arise. At this point, a fluctuation potential amount $|\Delta V_{LN}|$ of a transient response is Va−Vc−$V_{p-p}/2$, and Vc is Va−$V_{p-p}$, so that $|\Delta V_{LN}|$ becomes $V_{p-p}/2$ that is equal to $|\Delta V_{LP}|$.

Accordingly, when the modulation method is performed, the optical transmitting signal is output from the LD while the waveform is stabilized, because the normal phase input terminal 35a and the reverse phase input terminal 35b are equal to each other in the average potential fluctuation and time constant in the transient response state even if the LDD and the LD are capacitively coupled.

Figure 17:
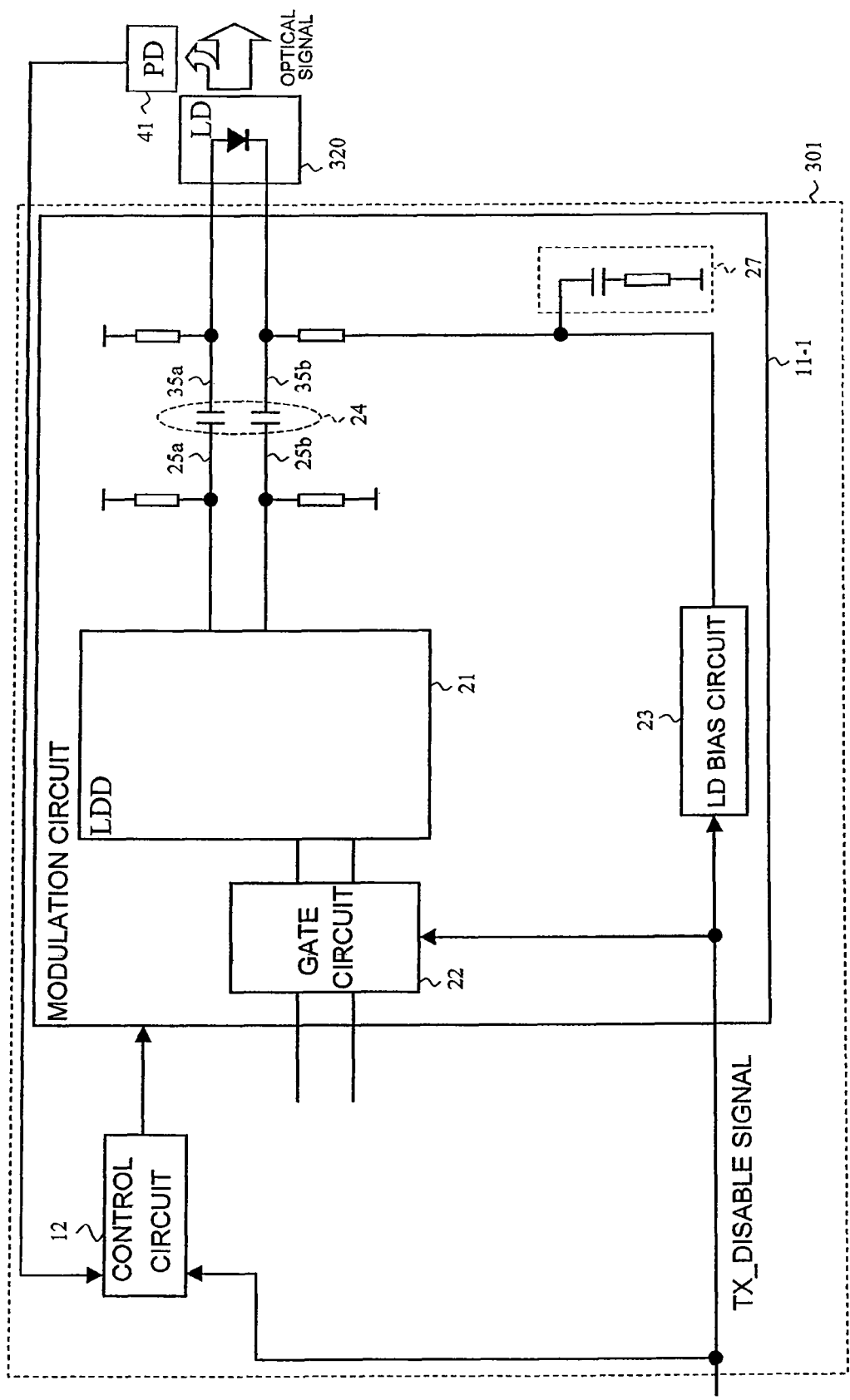
FIG. 17 is a block diagram explaining a configuration of an optical transmitter according to the invention.

FIG. 17 is a block diagram explaining another embodiment of the optical transmitter 301. The modulation device 301 may further include an optical monitor means for measuring the optical power of the optical signal emitted from the LD 320. The control circuit 12 performs feedback control adjusting at least one of the average potentials at the normal phase output terminal 25a, the reverse phase output terminal 25b, the normal phase input terminal 35a, and the reverse phase input terminal 35b such that the optical power measured by the optical monitor means becomes a predetermined value.

In the optical monitor means, an optical monitor in the LD 320 may be utilized, or a photoreceiver 41 disposed in a direction in which the LD 320 outputs the optical signal may be used as illustrated in FIG. 17. The modulation device 301 inputs some of the optical signal output from the LD 320 to the photoreceiver 41. The photoreceiver 41 inputs the output to the control circuit 12. The control circuit 12 controls the LD bias circuit 23 such that the LD bias circuit 23 passes the optimum bias current. Specifically, during the Tx_enable, the potential at the reverse phase input terminal 35b is lowered by $|\Delta V|$ corresponding to the bias current at that time. The modulation device 301 performs the feedback control based on the optical power of the optical signal output from the LD 320. The optical signal can stably be output by performing the feedback control, even if the optimum bias current fluctuates due to the temperature fluctuation or aging.

The control circuit 12 may perform the feedback control only for a time to be able to transmit the optical signal. Specifically, the photoreceiver 41 monitors the optical power of the optical signal during the Tx_enable in which the optical signal is output, and does not monitor the optical power of the optical signal during the Tx_disable in which the optical signal is not output. Thus, the optical power is monitored only during the Tx_enable while the optical power is not monitored during the Tx_disable, so that the modulation device 301 can maintain the already-set value of the average potential at each of the terminals (25a, 25b, 35a, and 35b) in order to compensate the bias fluctuation caused by the temperature or aging. Therefore, even for the long frame interval of the transmitted frame compared with the time constant of the circuit that performs the feedback control, the modulation device 301 can shorten the time to stabilize the optical output in the change in state from the Tx_disable to the Tx_enable.

Figure 18:
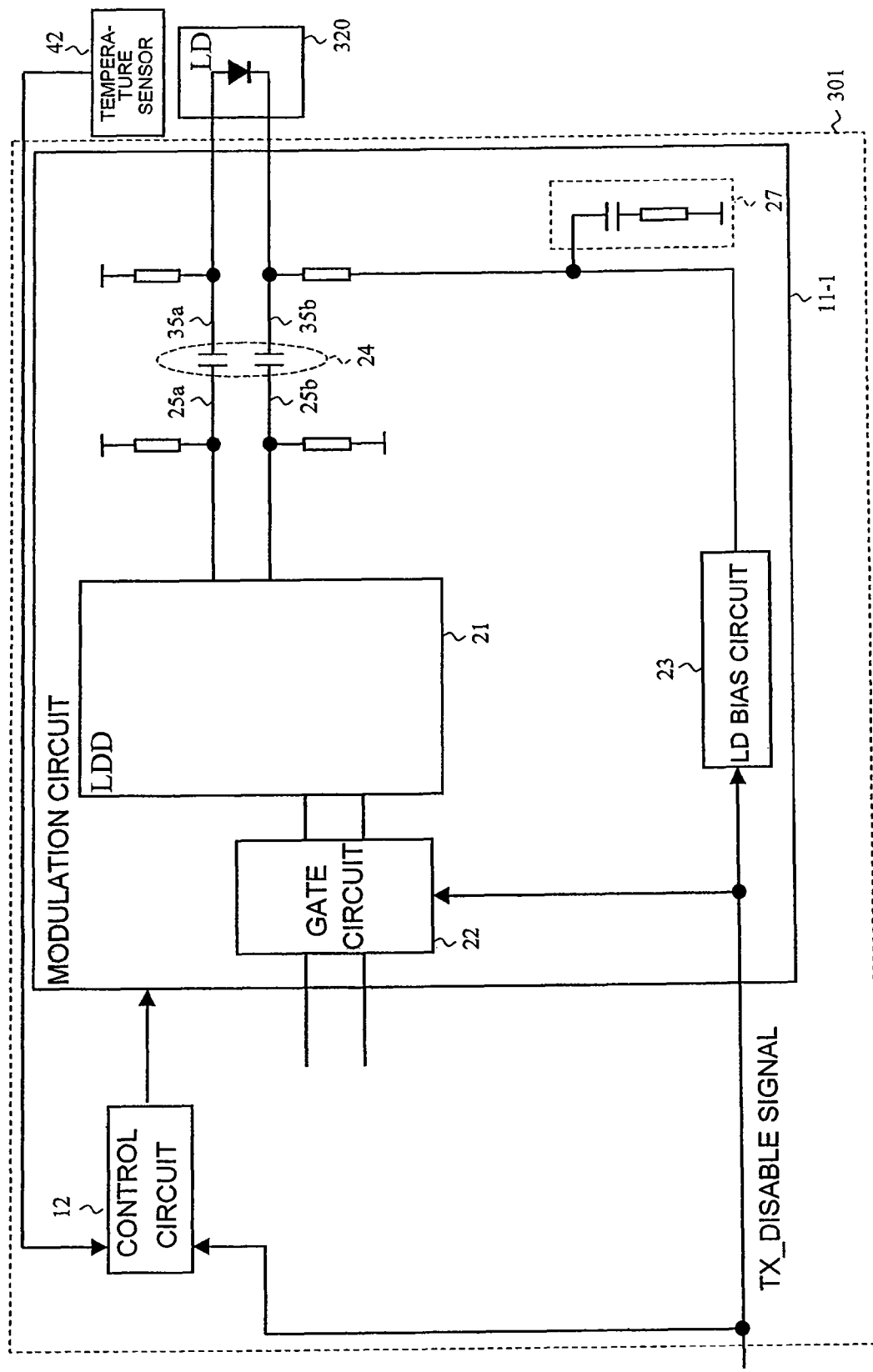
FIG. 18 is a block diagram explaining a configuration of an optical transmitter according to the invention.

FIG. 18 is a block diagram explaining another embodiment of the modulation device 301. The modulation device 301 may further include a temperature sensor 42 that measures a temperature of the LD 320 or a temperature near the LD 320. The control circuit 12 performs feedforward control adjusting at least one of the average potentials at the normal phase output terminal 25a, the reverse phase output terminal 25b, the normal phase input terminal 35a, and the reverse phase input terminal 35b such that intensity of the optical signal output from the LD 320 becomes a predetermined value even if the temperature of the LD 320 or the temperature near the LD 320 fluctuates.

The temperature sensor 42 inputs the result of the temperature measurement to the control circuit 12. The control circuit 12 controls the LD bias circuit 23 such that the LD bias circuit 23 passes the optimum bias current. Specifically, during the Tx_enable, the potential at the reverse phase input terminal 35b is lowered by $|\Delta V|$ corresponding to the bias current at that time. The modulation device 301 performs the feedforward control based on the temperature of the LD 320 or the temperature near the LD 320. The optical signal can stably be output by performing the feedforward control, even if the optimum bias current fluctuates due to the temperature fluctuation. In order to measure the intensity of the optical signal, the optical monitor in the LD 320 may be utilized LD 320, or the photoreceiver which is not illustrated in FIG. 18 may be disposed.

The configurations for performing the feedback control and feedforward control described in FIGS. 17 and 18 can be loaded in a combined manner into the modulation device 301.

Second Embodiment

Figure 7:
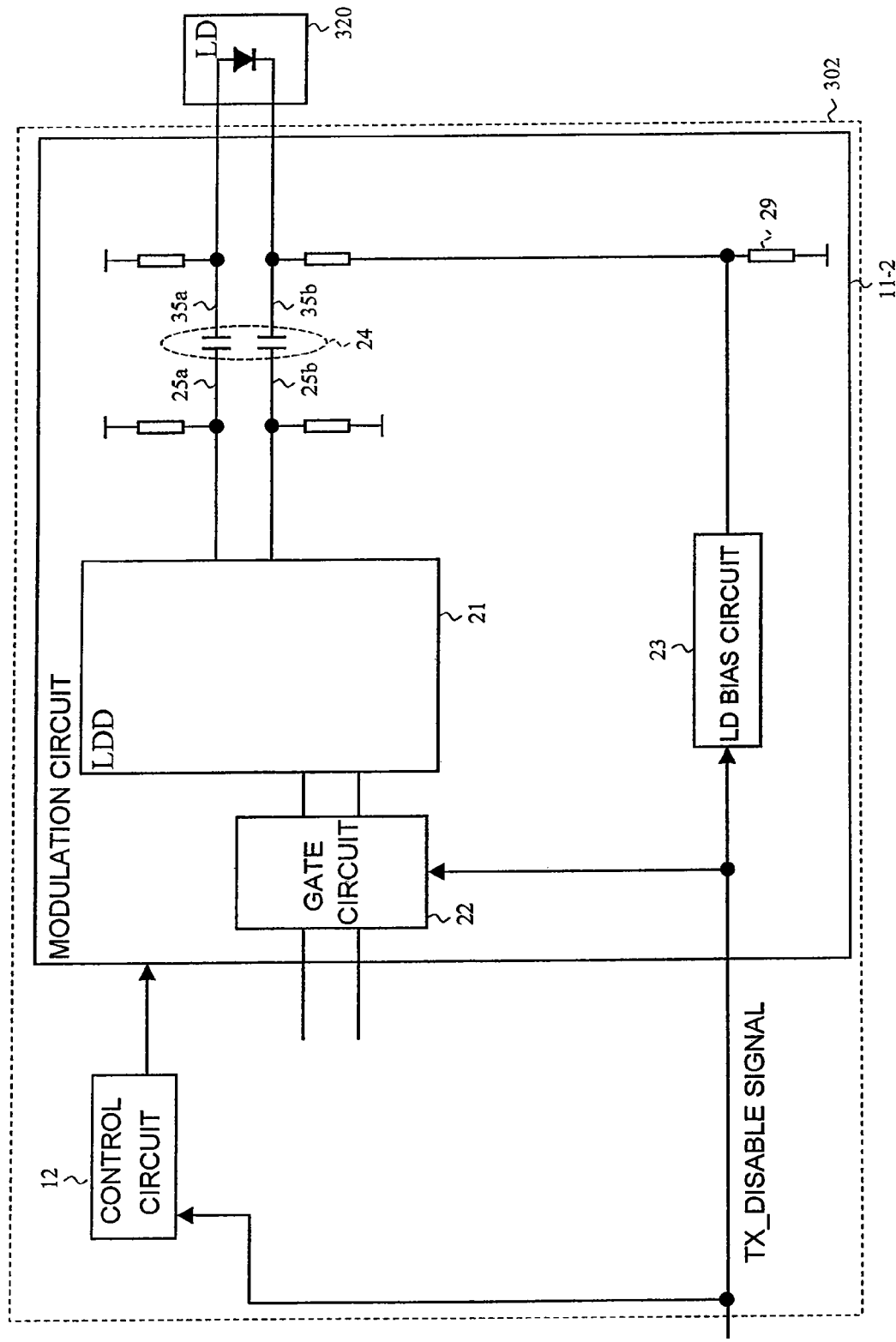
FIG. 7 is a block diagram explaining a configuration of an optical transmitter according to the invention.

FIG. 7 illustrates a block diagram explaining a configuration of an optical transmitter according to a second embodiment. The optical transmitter of FIG. 7 differs from the optical transmitter of FIG. 5 in that the optical transmitter of FIG. 7 includes a modulation device 302 as an alternative to the modulation device 301. The modulation device 302 includes a modulation circuit 11-2. The modulation circuit 11-2 differs from the modulation circuit 11-1 of FIG. 5 in that the reverse phase input terminal 35b and the LD bias circuit 23 are grounded through a resistor 29. The resistor 29 passes a leak current through the LD 320 to adjust the potential at the reverse phase input terminal 35b.

In the optical transmitter of FIG. 7, similarly to the optical transmitter of FIG. 5, the control circuit 12 sends the control signal to the modulation circuit 11-2 to control the modulation circuit 11-2 based on the Tx_enable signal or Tx_disable signal. The modulation method of the optical transmitter of FIG. 7 differs from that of the optical transmitter of FIG. 5 in the following point.

In the modulation method of the modulation device 302, the control circuit 12 controls the modulation circuit 11-2 such that the average potential at the reverse phase input terminal 35b is lowered with the same time constant as that in the transient state of the average potential at the normal phase input terminal 35a, and such that a difference potential amount in which a amplitude voltage of the modulation signal is subtracted from a difference between the average potential at the normal phase input terminal 35a and the average potential at the reverse phase input terminal 35b after the transient state is previously changed in the average potential at the reverse phase input terminal 35b before the average potential at the normal phase input terminal 35a and the average potential at the reverse phase input terminal 35b fluctuate.

Figure 6:
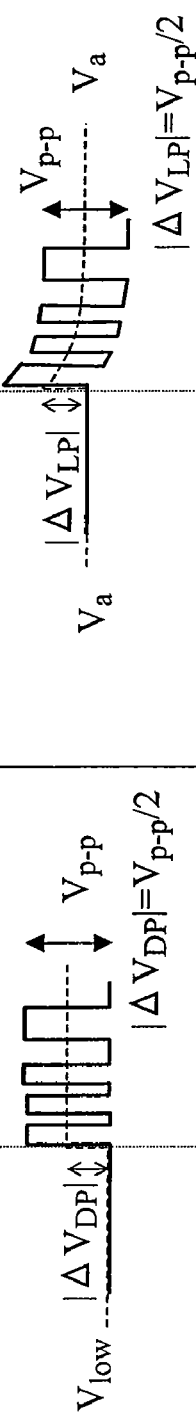
FIG. 6 is a view illustrating a potential state at each terminal in a modulation device of an optical transmitter according to the invention.

FIG. 6 illustrates a potential state at each terminal in the modulation device of the second embodiment. The potential fluctuation at each terminal is indicated by the solid line and the average potential is indicated by the broken line.

At the normal phase output terminal 25a, it is assumed that the potential $V_{low}$ is retained during the Tx_disable while the modulation signal having amplitude $V_{p-p}$ is output during the Tx_enable. The average potential fluctuation $|\Delta V_{DP}|$ becomes $V_{p-p}/2$ in the change in state from the Tx_disable to the Tx_enable. On the other hand, at the reverse phase output terminal 25b, it is assumed that the potential $V_{high}$ is retained during the Tx_disable while the modulation signal having the amplitude $V_{p-p}$ is output during the Tx_enable. The average potential fluctuation $|\Delta V_{DN}|$ becomes $V_{p-p}/2$ in the change in state from the Tx_disable to the Tx_enable.

At this point, at the normal phase input terminal 35a, the potential Va is retained during the Tx_disable, and the modulation signal having the amplitude $V_{p-p}$ is input during the Tx_enable. Because the LDD and the LD are capacitively coupled in the change in state from the Tx_disable to the Tx_enable, after the average potential rises to $V_{p-p}/2$, the average potential declines to Va with a certain time constant, and the modulation signal having the average potential Va and the amplitude $V_{p-p}$ is then input to the LD. At this point, the fluctuation potential amount $|\Delta V_{LP}|$ of the transient response becomes $V_{p-p}/2$ that is equal to $|\Delta V_{DP}|$.

At the reverse phase input terminal 35b, the potential Va−$|\Delta V|$ is retained during the Tx_disable, and the average potential is lowered to Vc in order to pass the bias current through the LD at the same time as the modulation signal having the amplitude $V_{p-p}$ is input during the Tx_enable. At this point, a resistance value of the added resistor is adjusted such that $|\Delta V|$ becomes equal to Va−Vc−$V_{p-p}$ by the passage of the leak current through the LD. Because the LDD and the LD are capacitively coupled in the change in state from the Tx_disable to the Tx_enable, the average potential declines to $V_{p-p}/2$, and further declines to Vc with the same time constant as that of the normal phase input terminal 35a so as to pass the bias current, and the modulation signal having the average potential Vc and the amplitude $V_{p-p}$ is then input to the LD. When the need to adjust the time constant at the reverse phase input terminal 35b arises, similarly to the first embodiment, the time constant at the reverse phase input terminal 35b is adjusted to the same time constant as that at the normal phase input terminal 35a by providing the integration circuit 27. At this point, the fluctuation potential amount $|\Delta V_{LN}|$ of the transient response becomes $V_{p-p}/2$ that is equal to $|\Delta V_{LP}|$.

Accordingly, when the modulation is performed by the technique of the second embodiment, the optical transmitting signal is output from the LD while the waveform is stabilized, because the normal phase input terminal 35a and the reverse phase input terminal 35b are equal to each other in the average potential fluctuation and time constant in the transient response state even if the LDD and the LD are capacitively coupled.

Figure 19:
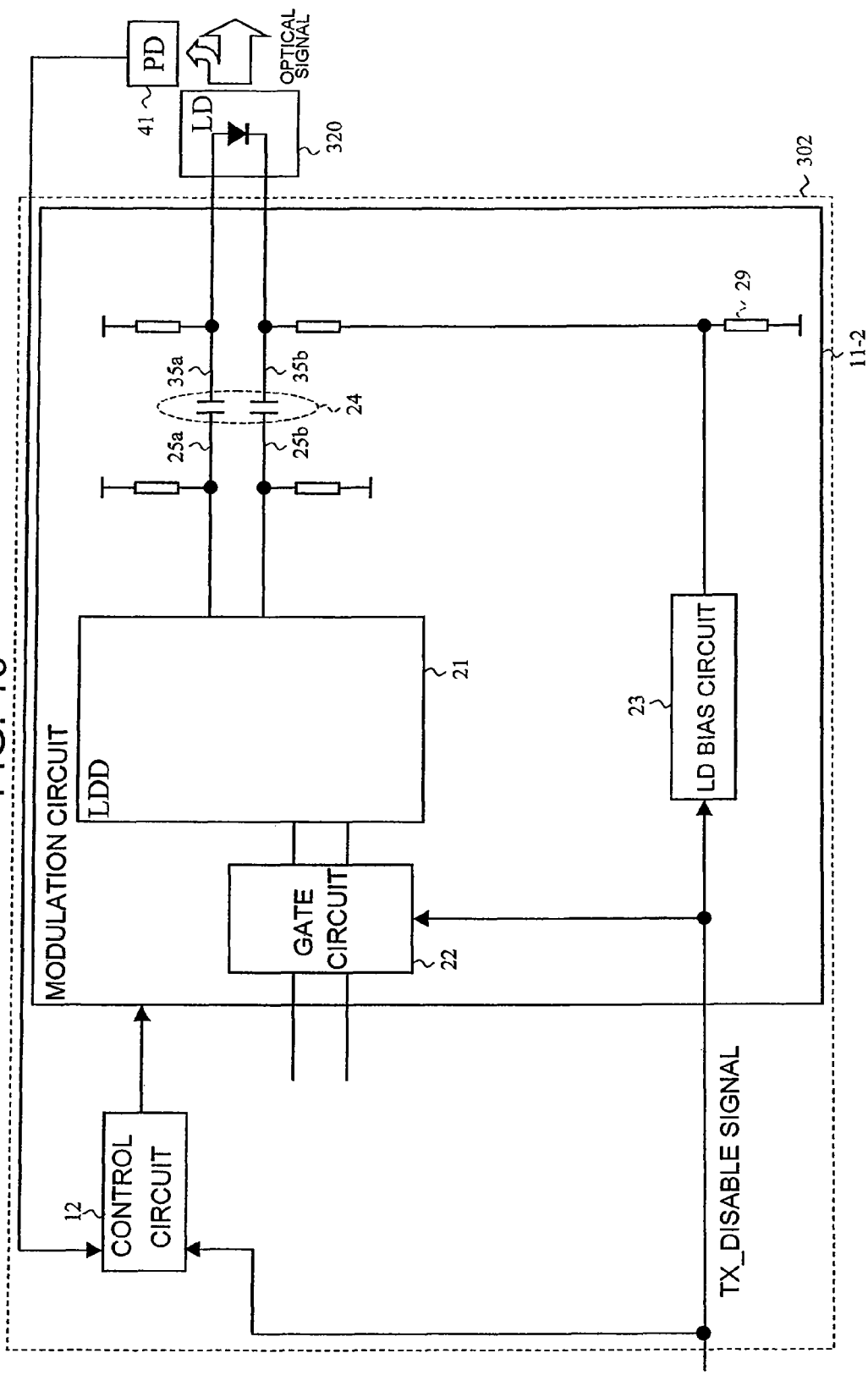
FIG. 19 is a block diagram explaining a configuration of an optical transmitter according to the invention.

FIG. 19 illustrates a block diagram of the modulation device 302 to which the configuration for performing the feedback control described in FIG. 17 is added. The modulation device 302 can stably output the optical signal by performing the feedback control, even if the optimum bias current fluctuates due to the temperature fluctuation or aging. The feedback control may be performed only for the time to be able to transmit the optical signal. The optical power is monitored only during the Tx_enable while the optical power is not monitored during the Tx_disable, so that the modulation device 302 can maintain the already-set value of the average potential at each of the terminals (25a, 25b, 35a, and 35b) in order to compensate the bias fluctuation caused by the temperature or aging. Therefore, even for the long frame interval of the transmitted frame compared with the time constant of the circuit that performs the feedback control, the modulation device 302 can shorten the time to stabilize the optical output in the change in state from the Tx_disable to the Tx_enable.

Figure 20:
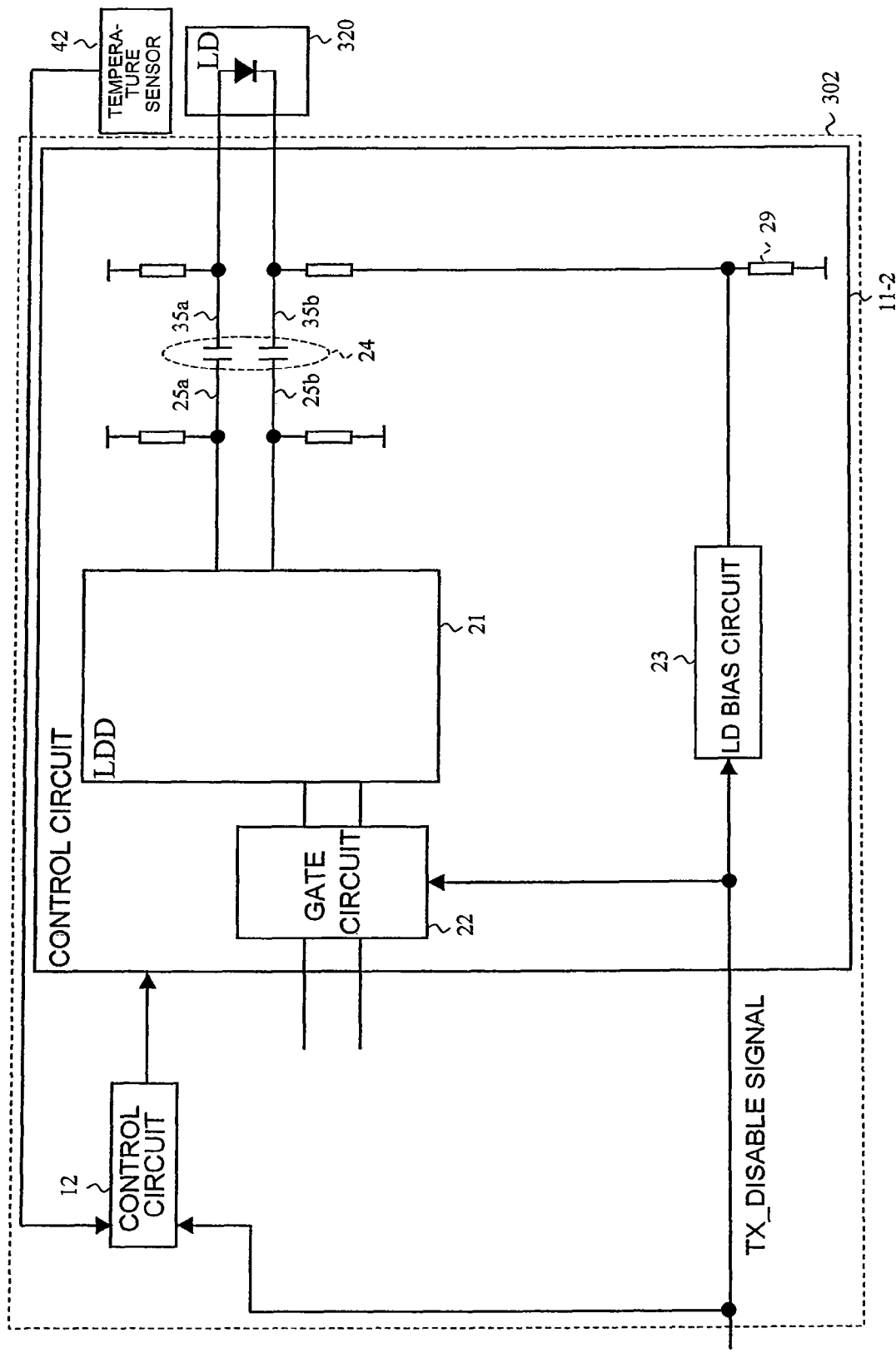
FIG. 20 is a block diagram explaining a configuration of an optical transmitter according to the invention.

FIG. 20 illustrates a block diagram of the modulation device 302 to which the configuration for performing the feedforward control described in FIG. 18 is added. The modulation device 302 can stably output the optical signal by performing the feedforward control, even if the optimum bias current fluctuates due to the temperature fluctuation.

The configurations for performing the feedback control and feedforward control described in FIGS. 19 and 20 can be loaded in a combined manner into the modulation device 302.

Third Embodiment

Figure 9:
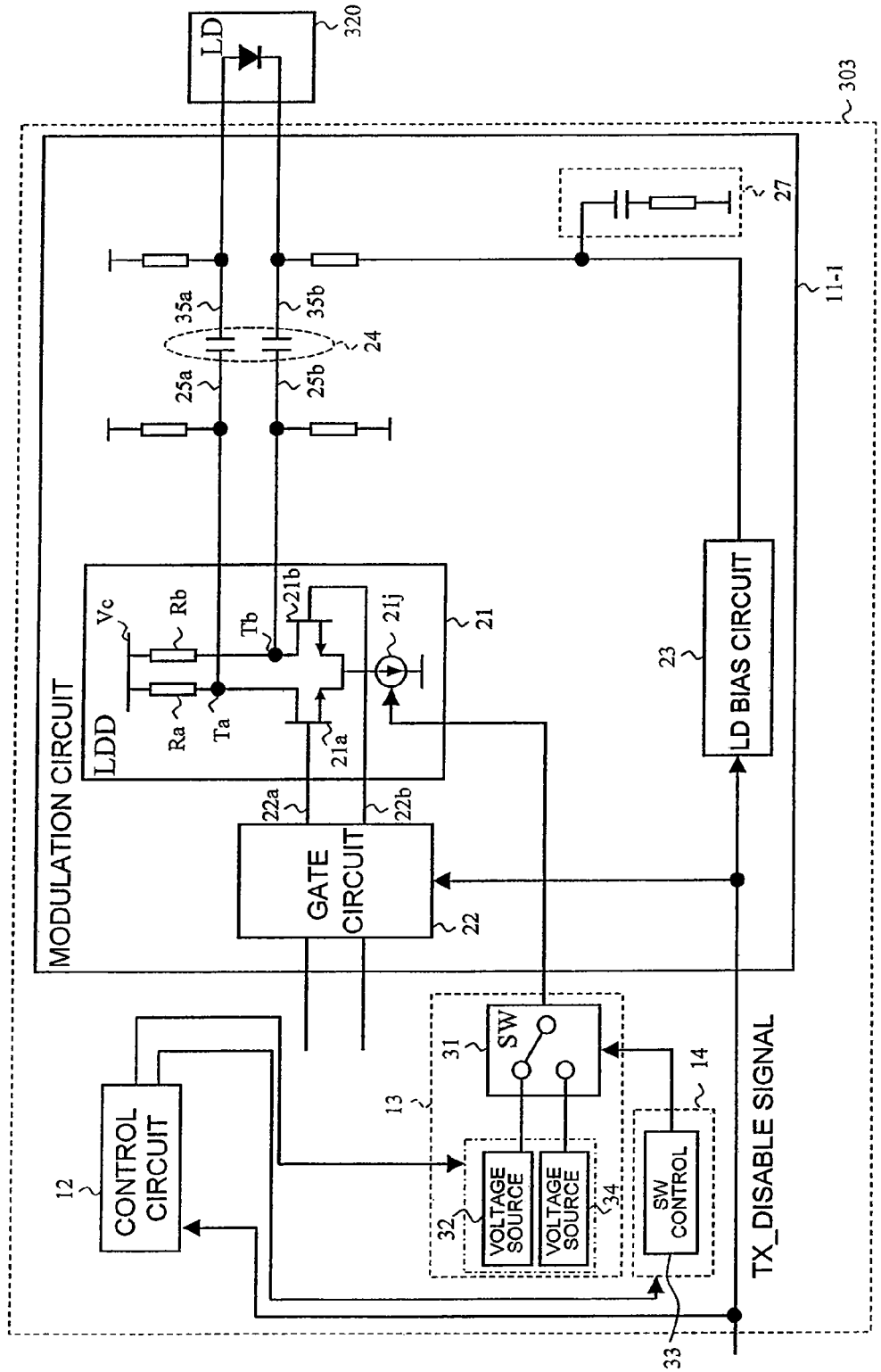
FIG. 9 is a block diagram explaining a configuration of an optical transmitter according to the invention.

FIG. 9 illustrates a block diagram explaining a configuration of an optical transmitter according to a third embodiment. The optical transmitter of FIG. 9 differs from the optical transmitter of FIG. 5 in that the optical transmitter of FIG. 9 includes a modulation device 303 as an alternative to the modulation device 301. The modulation device 303 includes the control circuit 12, the modulation circuit 11-1, a voltage source circuit 13, and a voltage controller 14. The LDD 21 includes a current source circuit 21j that is connected to the normal phase output terminal 25a and reverse phase output terminal 25b. Voltage sources 32 and 34 that provide different potentials and a switch (SW) 31 that selects one of the voltage sources 32 and 34 are connected in series to be able to form the voltage source circuit 13. For example, the voltage controller 14 can be formed by a SW control unit 33 that controls the switch 31. The control circuit 12 controls the potentials at the voltage source 32 and voltage source 34.

The SW 31 is connected to the current source circuit 21j of the LDD 21 to switch between the voltage sources 32 and 34 that provide the different potentials. Based on the external Tx_enable signal or Tx_disable signal, the SW control unit 33 controls the SW 31 by determining whether the potential $V_{low}$ or the potential $V_{low}-|\Delta V|$ is provided to the normal phase output terminal 25a. The control circuit 12 may determine the Tx_enable signal or Tx_disable signal to provide an instruction to switch the SW 31 to the voltage controller 14. In the modulation device 303, the voltage source circuit 13 and the voltage controller 14 adjust the current source circuit 21j of the LDD 21, which allows the change in average potential at the normal phase output terminal 25a.

In the optical transmitter of FIG. 9, similarly to the optical transmitter of FIG. 5, the control circuit 12 sends the control signal to the modulation circuit 11-1 to control the modulation circuit 11-1 based on the Tx_enable signal or Tx_disable signal. The modulation method of the optical transmitter of FIG. 9 differs from that of the optical transmitter of FIG. 5 in the following point.

In the modulation method of the modulation device 303, the control circuit 12 controls the modulation circuit 11-1 such that the average potential at the reverse phase input terminal 35b is lowered with the same time constant as that in the transient state of the average potential at the normal phase input terminal 35a, and such that the difference potential amount in which the amplitude voltage of the modulation signal is subtracted from the difference between the average potential at the normal phase input terminal 35a and the average potential at the reverse phase input terminal 35b after the transient state is previously changed in the average potential at the normal phase output terminal 25a before the average potential at the normal phase input terminal 35a and the average potential at the reverse phase input terminal 35b fluctuate.

Figure 8:
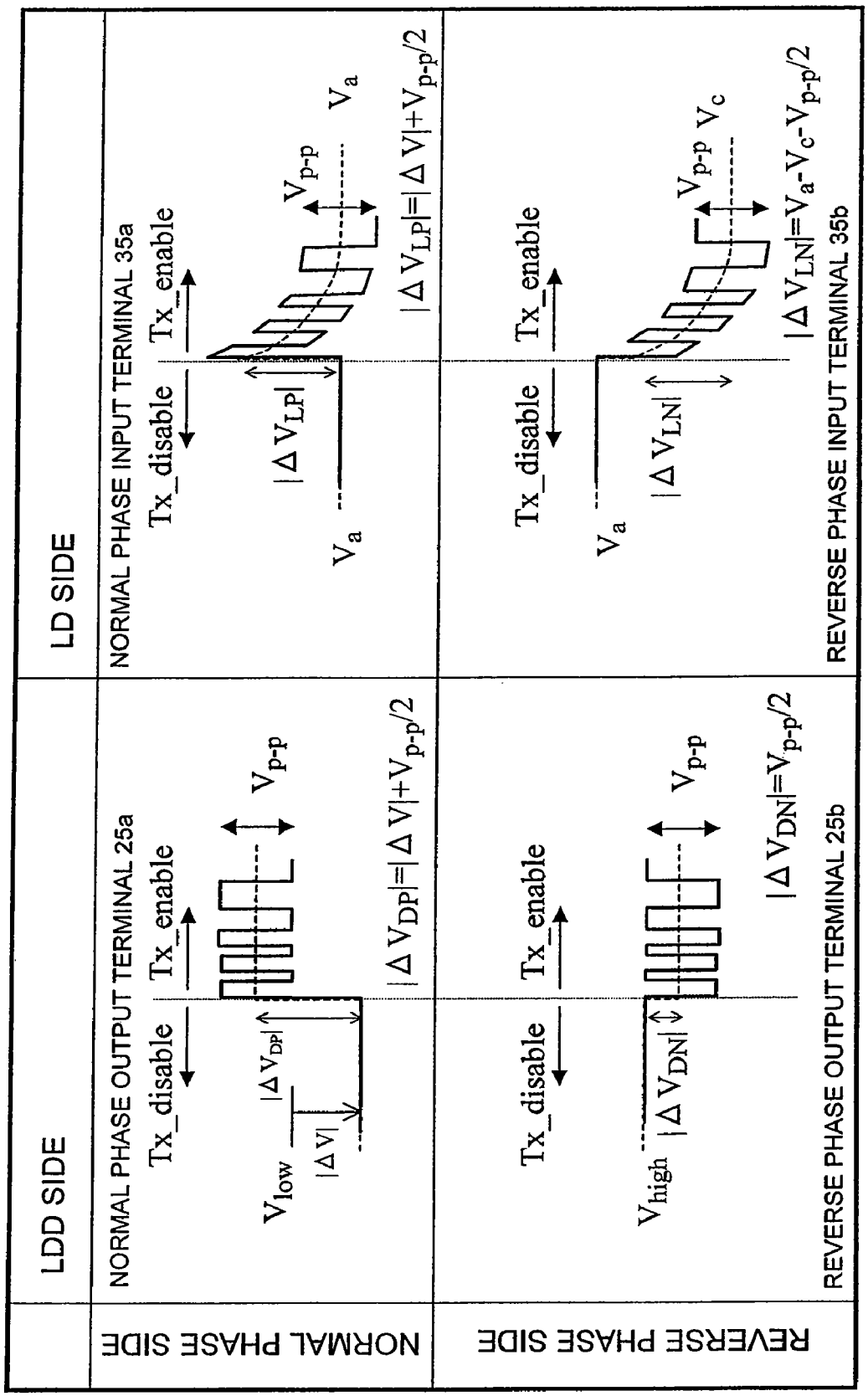
FIG. 8 is a view illustrating a potential state at each terminal in a modulation device of an optical transmitter according to the invention.

FIG. 8 illustrates a potential state at each terminal in the modulation device of the third embodiment. The potential fluctuation at each terminal is indicated by the solid line and the average potential is indicated by the broken line.

At the normal phase output terminal 25a, it is assumed that the potential $V_{low}-|\Delta V|$ is retained during the Tx_disable while the potential is raised to $V_{low}$ and the modulation signal having amplitude $V_{p-p}$ is output during the Tx_enable. The SW control unit controls the SW onto the side of the voltage source 32 that provides the high voltage during the Tx_disable and controls the SW onto the side of the voltage source 34 that provides the low voltage during the Tx_enable. Specifically the control is performed as follows.

The case during the Tx_disable will be described. At this point, the current is always passed through a path on the side of a transistor 21a of the LDD 21.

The gate circuit 22 applies the voltage to a gate of the transistor 21a on a normal phase side 22a to pass the current through the path on the side of the transistor 21a. Therefore, a voltage drop is generated by a resistor Ra, and the potential at a connection end Ta becomes lower than the power supply Vc, which allows the potential at the normal phase output terminal 25a to be lowered to $V_{low}-|\Delta V|$ during the Tx_disable.

On the other hand, the gate circuit 22 does not apply the voltage to a gate of a transistor 21b on a reverse phase side 22b, thereby stopping the current through the path on the side of the transistor 21b. Therefore, the potential at a connection end Tb becomes equal to the power supply Vc, and the potential at the reverse phase output terminal 25b can be retained to $V_{high}$ without fluctuation.

The case during the Tx_enable will be described. At this point, the current is alternatively passed through the path on the side of the transistor 21a and the path on the side of the transistor 21b of the LDD 21.

When the signal "1" is input to the gate circuit 22, the gate circuit 22 does not apply the voltage to the gate of the transistor 21a on the normal phase side 22a, and stops the current through the path on the side of the transistor 21a, and applies the voltage to the gate of the transistor 21b on the reverse phase side 22b to pass the current through the path on the side of the transistor 21b. Therefore, the potential at the connection end Ta becomes equal to that at the power supply Vc, and the potential at the normal phase output terminal 25a can be retained to $V_{high}$ without fluctuation. In the potential at the connection end Tb, the potential at the reverse phase output terminal 25b can be lowered to $V_{low}$ due to the voltage drop by the resistor Rb.

When the signal "0" is input to the gate circuit 22, the gate circuit 22 applies the voltage to the gate of the transistor 21a on the normal phase side 22a to pass the current through the path on the side of the transistor 21a, and does not apply the voltage to the gate of the transistor 21b on the reverse phase side 22b, and stops the current through the path on the side of the transistor 21b. Therefore, the voltage drop is generated in the potential at the connection end Ta by the resistor Ra, and the potential at the normal phase output terminal 25a can be lowered to $V_{low}$. The potential at the connection end Tb becomes equal to the power supply Vc, and the potential at the reverse phase output terminal 25b can be retained to $V_{high}$ without fluctuation.

By connecting the SW 31 to the voltage source 32 during the Tx_disable, the potential at the normal phase output terminal 25a is lowered by $|\Delta V|=Va-Vc-V_{p-p}$ with respect to the potential $V_{low}$ during the Tx_enable. The average potential fluctuation $|\Delta V_{DP}|$ becomes $|\Delta V|+V_{p-p}/2$ in the change in state from the Tx_disable to the Tx_enable. On the other hand, at the reverse phase output terminal 25b, the potential is retained to $V_{high}$ during the Tx_disable, and the modulation signal having the amplitude $V_{p-p}$ is output during the Tx_enable. The average potential fluctuation $|\Delta V_{DN}|$ becomes $V_{p-p}/2$ in the change in state from the Tx_disable to the Tx_enable.

At this point, at the normal phase input terminal 35a, the potential Va is retained during the Tx_disable, and the modulation signal having the amplitude $V_{p-p}$ is input during the Tx_enable. Because the LDD and the LD are capacitively coupled in the change in state from the Tx_disable to the Tx_enable, after the average potential rises to $|\Delta V|+V_{p-p}/2$, the average potential declines to Va with a certain time constant, and the modulation signal having the average potential Va and the amplitude $V_{p-p}$ is then input to the LD. At this point, the fluctuation potential amount $|\Delta V_{LP}|$ of the transient response is $|\Delta V|+V_{p-p}/2=Va-Vc-V_{p-p}/2$ that is equal to $|\Delta V_{DP}|$.

At the reverse phase input terminal 35b, the potential Va is retained during the Tx_disable, and the average potential is lowered to Vc in order to pass the bias current through the LD at the same time as the modulation signal having the amplitude $V_{p-p}$ is input during the Tx_enable. Because the LDD and the LD are capacitively coupled in the change in state from the Tx_disable to the Tx_enable, after the average potential declines to $V_{p-p}/2$, the average potential further declines to Vc with the same time constant as the normal phase input terminal 35a so as to pass the bias current, and the modulation signal having the average potential Vc and the amplitude $V_{p-p}$ is then input to the LD. When the need to adjust the time constant at the reverse phase input terminal 35b arises, similarly to the first embodiment, the time constant at the reverse phase input terminal 35b is adjusted to the same time constant as that at the normal phase input terminal 35a by providing the integration circuit 27. At this point, the fluctuation potential amount $|\Delta V_{LN}|$ of the transient response is Va-Vc-$V_{p-p}/2$ that is equal to $|\Delta V_{LP}|$.

Accordingly, when the modulation is performed by the technique of the third embodiment, the optical transmitting signal is output from the LD while the waveform is stabilized, because the normal phase input terminal 35a and the reverse phase input terminal 35b are equal to each other in the average potential fluctuation and time constant in the transient response state even if the LDD and the LD are capacitively coupled.

In the third embodiment, during the Tx_disable, the potential at the normal phase output terminal 25a is adjusted using the voltage controller and the voltage source circuit including the switch and the two voltage sources. Alternatively, a variable current source circuit that can adjust the potential in the above-described manner may be used as the current source of the LDD circuit. A pair of the normal phase output terminal 25a and the reverse phase output terminal 25b may be formed as a Darlington connection type differential pair.

Figure 21:
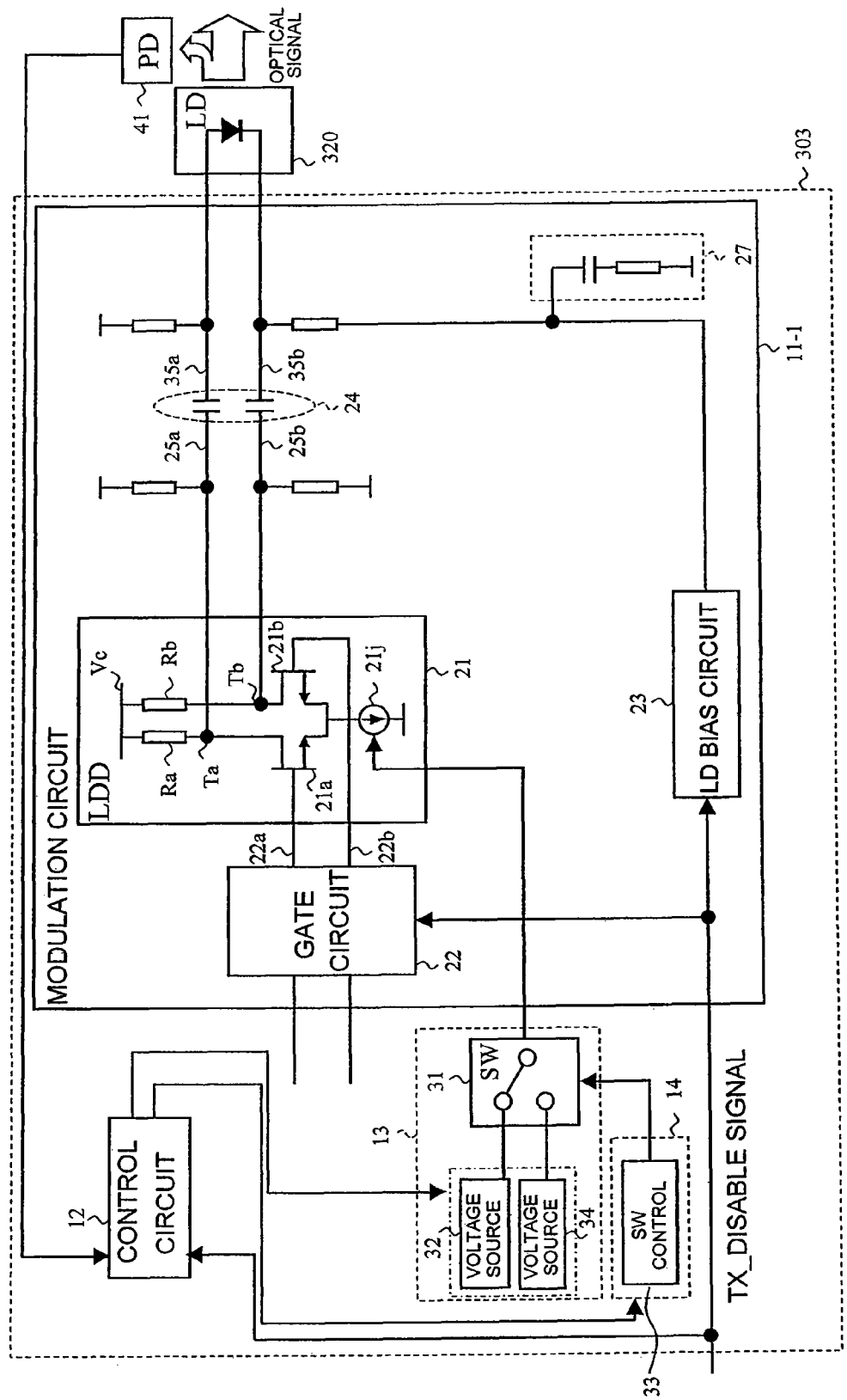
FIG. 21 is a block diagram explaining a configuration of an optical transmitter according to the invention.

FIG. 21 illustrates a block diagram of the modulation device 303 to which the configuration for performing the feedback control described in FIG. 17 is added. The modulation device 303 can stably output the optical signal by performing the feedback control, even if the optimum bias current fluctuates due to the temperature fluctuation or aging. The feedback control may be performed only for the time to be able to transmit the optical signal. The optical power is monitored only during the Tx_enable while the optical power is not monitored during the Tx_disable, so that the modulation device 303 can maintain the already-set value of the average potential at each of the terminals (25a, 25b, 35a, and 35b) in order to compensate the bias fluctuation caused by the temperature or aging. Therefore, even for the long frame interval of the transmitted frame compared with the time constant of the circuit that performs the feedback control, the modulation device 303 can shorten the time to stabilize the optical output in the change in state from the Tx_disable to the Tx_enable.

Figure 22:
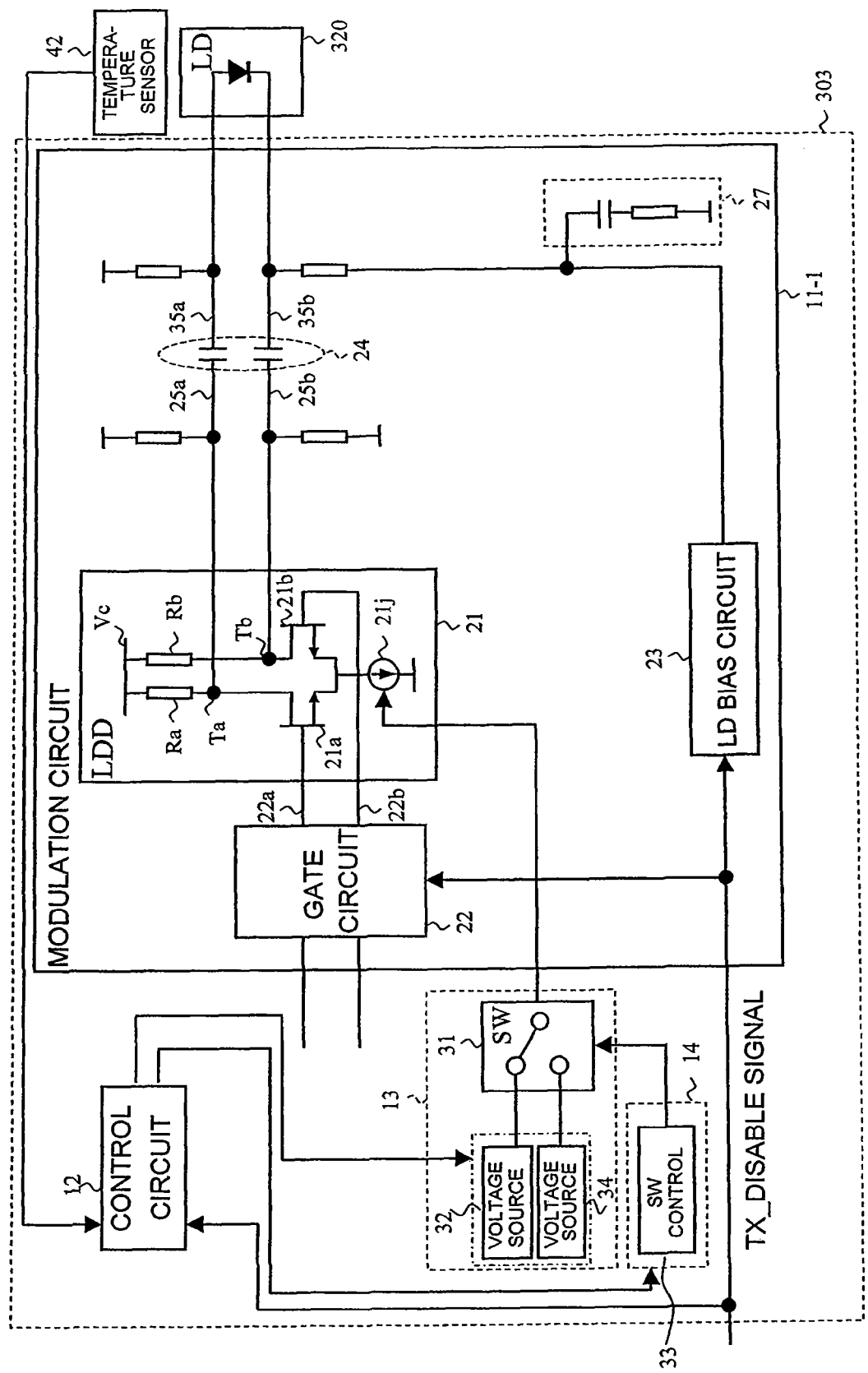
FIG. 22 is a block diagram explaining a configuration of an optical transmitter according to the invention.

FIG. 22 illustrates a block diagram of the modulation device 303 to which the configuration for performing the feedforward control described in FIG. 18 is added. The modulation device 303 can stably output the optical signal by performing the feedforward control, even if the optimum bias current fluctuates due to the temperature fluctuation.

The configurations for performing the feedback control and feedforward control described in FIGS. 21 and 22 can be loaded in a combined manner into the modulation device 303.

Fourth Embodiment

Figure 11:
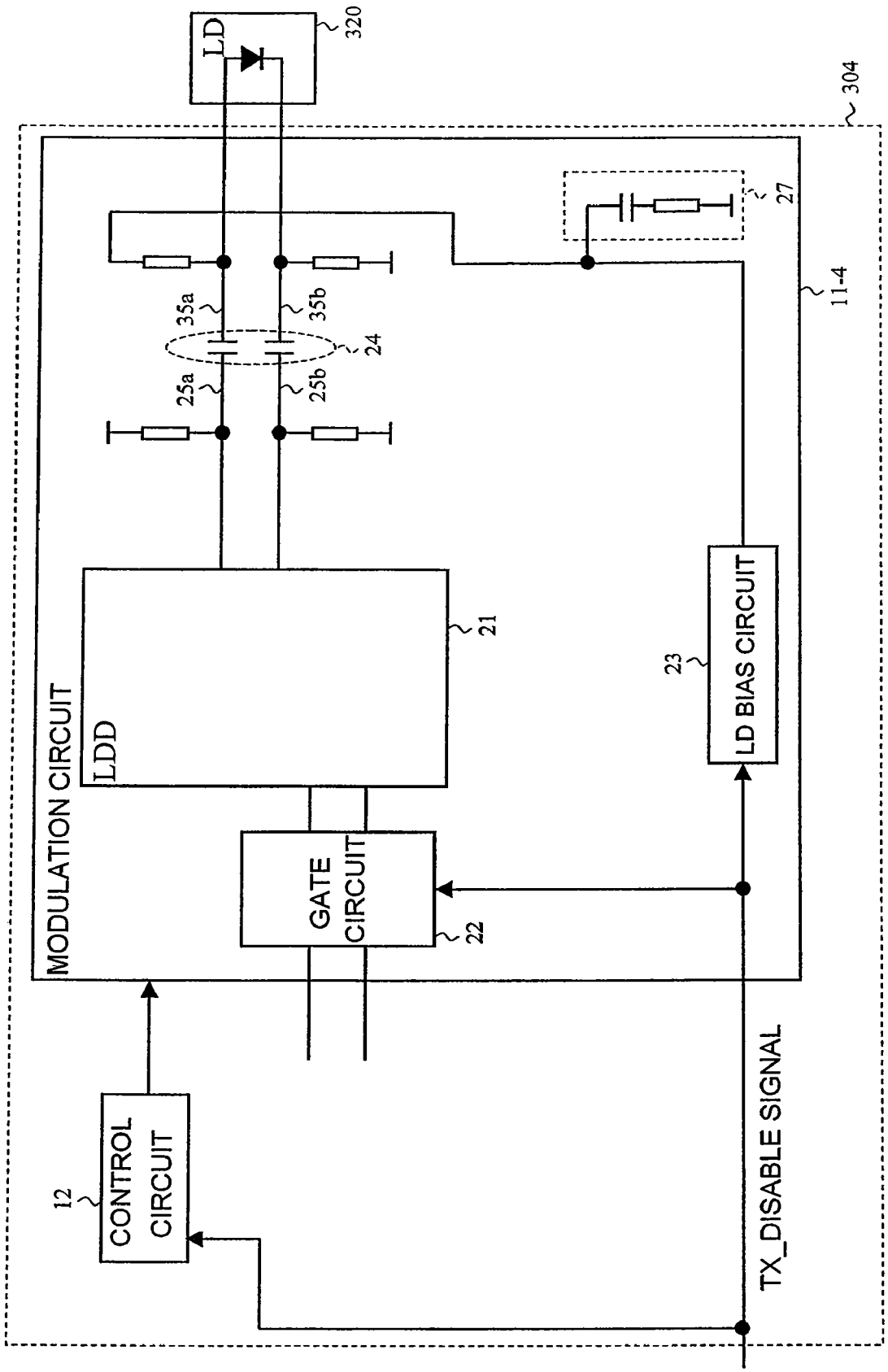
FIG. 11 is a block diagram explaining a configuration of an optical transmitter according to the invention.

FIG. 11 illustrates a block diagram explaining a configuration of an optical transmitter according to a fourth embodiment. The optical transmitter of FIG. 11 differs from the optical transmitter of FIG. 5 in that the optical transmitter of FIG. 11 includes a modulation device 304 as an alternative to the modulation device 301. The modulation device 304 includes a modulation circuit 11-4. The modulation circuit 11-4 differs from the modulation circuit 11-1 of FIG. 5 in that the output of the LD bias circuit 23 and the integration circuit 27 are connected to the normal phase input terminal 35a.

In the optical transmitter of FIG. 11, similarly to the optical transmitter of FIG. 5, the control circuit 12 sends the control signal to the modulation circuit 11-4 to control the modulation circuit 11-4 based on the Tx_enable signal or Tx_disable signal. The modulation method of the optical transmitter of FIG. 11 differs from that of the optical transmitter of FIG. 5 in the following point.

In the modulation method of the modulation device 304, the control circuit 12 controls the modulation circuit 11-4 such that the average potential at the normal phase input terminal 35a is raised by an amplitude voltage of a modulation signal with the same time constant as that in the transient state of the average potential at the reverse phase input terminal 35b.

Figure 10:
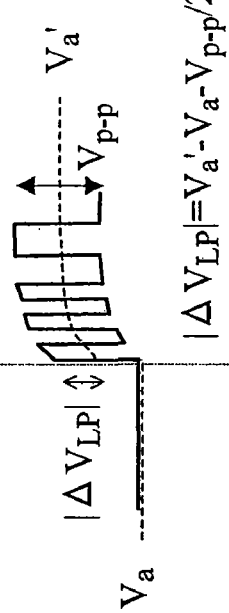
FIG. 10 is a view illustrating a potential state at each terminal in a modulation device of an optical transmitter according to the invention.

FIG. 10 illustrates a potential state at each terminal in a modulation device of the fourth embodiment. The potential fluctuation at each terminal is indicated by the solid line and the average potential is indicated by the broken line.

At the normal phase output terminal 25a, it is assumed that the potential $V_{low}$ is retained during the Tx_disable while the modulation signal having amplitude $V_{p-p}$ is output during the Tx_enable. The average potential fluctuation $|\Delta V_{DP}|$ becomes $V_{p-p}/2$ in the change in state from the Tx_disable to the Tx_enable. On the other hand, at the reverse phase output terminal 25b, it is assumed that the potential $V_{high}$ is retained during the Tx_disable while the modulation signal having the amplitude $V_{p-p}$ is output during the Tx_enable. The average potential fluctuation $|\Delta V_{DN}|$ becomes $V_{p-p}/2$ in the change in state from the Tx_disable to the Tx_enable.

At this point, at the reverse phase input terminal 35b, the potential Va is retained during the Tx_disable, and the modulation signal having the amplitude $V_{p-p}$ is input during the Tx_enable. Because the LDD and the LD are capacitively coupled in the change in state from the Tx_disable to the Tx_enable, after the average potential declines to $V_{p-p}/2$, the average potential rises to Va with a certain time constant, and the modulation signal having the average potential Va and the amplitude $V_{p-p}$ is then input to the LD. At this point, the fluctuation potential amount $|\Delta V_{LN}|$ of the transient response is $V_{p-p}/2$ that is equal to $|\Delta V_{DN}|$.

At the normal phase input terminal 35a, the potential Va is retained during the Tx_disable, and the average potential is raised to Va' ($=Va+V_{p-p}$) that becomes the same potential fluctuation as the amplitude $V_{p-p}$ of the modulation signal so as to pass the bias current through the LD at the same time as the modulation signal having the amplitude $V_{p-p}$ is input during the Tx_enable. Because the LDD and the LD are capacitively coupled in the change in state from the Tx_disable to the Tx_enable, after the average potential rises to $V_{p-p}/2$, the average potential further rises to Va' with the same time constant as that at the reverse phase input terminal 35b so as to pass the bias current, and the modulation signal having the average potential Va' and the amplitude $V_{p-p}$ is then input to the LD. The integration circuit 27 is eliminated when the need to adjust the time constant does not arises. At this point, the fluctuation potential amount $|\Delta V_{LP}|$ of the transient response is $V_{p-p}/2$ that is equal to $|\Delta V_{LN}|$.

Accordingly, when the modulation is performed by the technique of the fourth embodiment, the optical transmitting signal is output from the LD while the waveform is stabilized, because the normal phase input terminal 35a and the reverse phase input terminal 35b are equal to each other in the average potential fluctuation and time constant in the transient response state even if the LDD and the LD are capacitively coupled.

Figure 23:
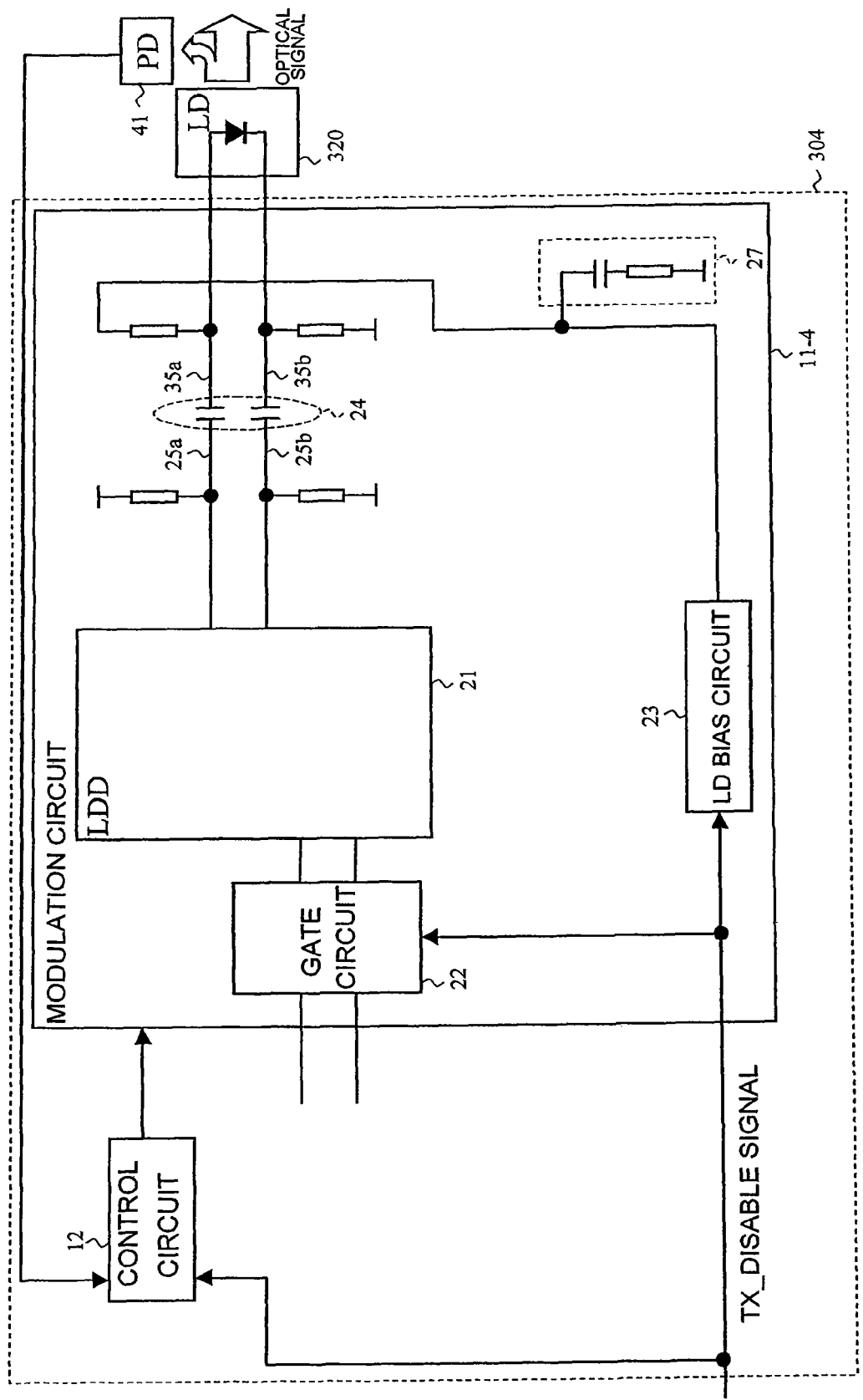
FIG. 23 is a block diagram explaining a configuration of an optical transmitter according to the invention.

FIG. 23 illustrates a block diagram of the modulation device 304 to which the configuration for performing the feedback control described in FIG. 17 is added. The modulation device 304 can stably output the optical signal by performing the feedback control, even if the optimum bias current fluctuates due to the temperature fluctuation or aging. The feedback control may be performed only for the time to be able to transmit the optical signal. The optical power is monitored only during the Tx_enable while the optical power is not monitored during the Tx_disable, so that the modulation device 304 can maintain the already-set value of the average potential at each of the terminals (25a, 25b, 35a, and 35b) in order to compensate the bias fluctuation caused by the temperature or aging. Therefore, even for the long frame interval of the transmitted frame compared with the time constant of the circuit that performs the feedback control, the modulation device 304 can shorten the time to stabilize the optical output in the change in state from the Tx_disable to the Tx_enable.

Figure 24:
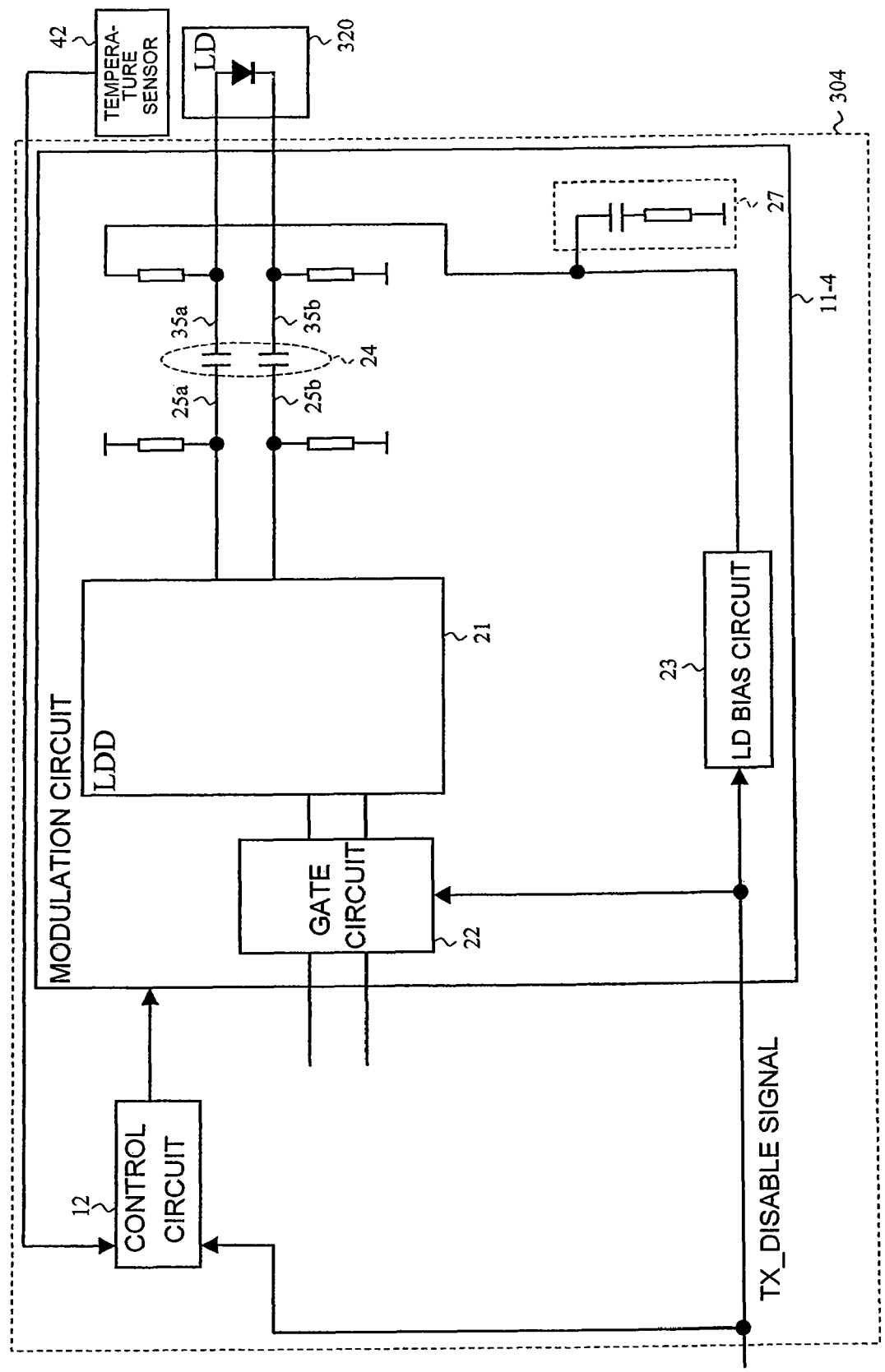
FIG. 24 is a block diagram explaining a configuration of an optical transmitter according to the invention.

FIG. 24 illustrates a block diagram of the modulation device 304 to which the configuration for performing the feedforward control described in FIG. 18 is added. The modulation device 304 can stably output the optical signal by performing the feedforward control, even if the optimum bias current fluctuates due to the temperature fluctuation.

The configurations for performing the feedback control and feedforward control described in FIGS. 23 and 24 can be loaded in a combined manner into the modulation device 304.

Fifth Embodiment

Figure 13:
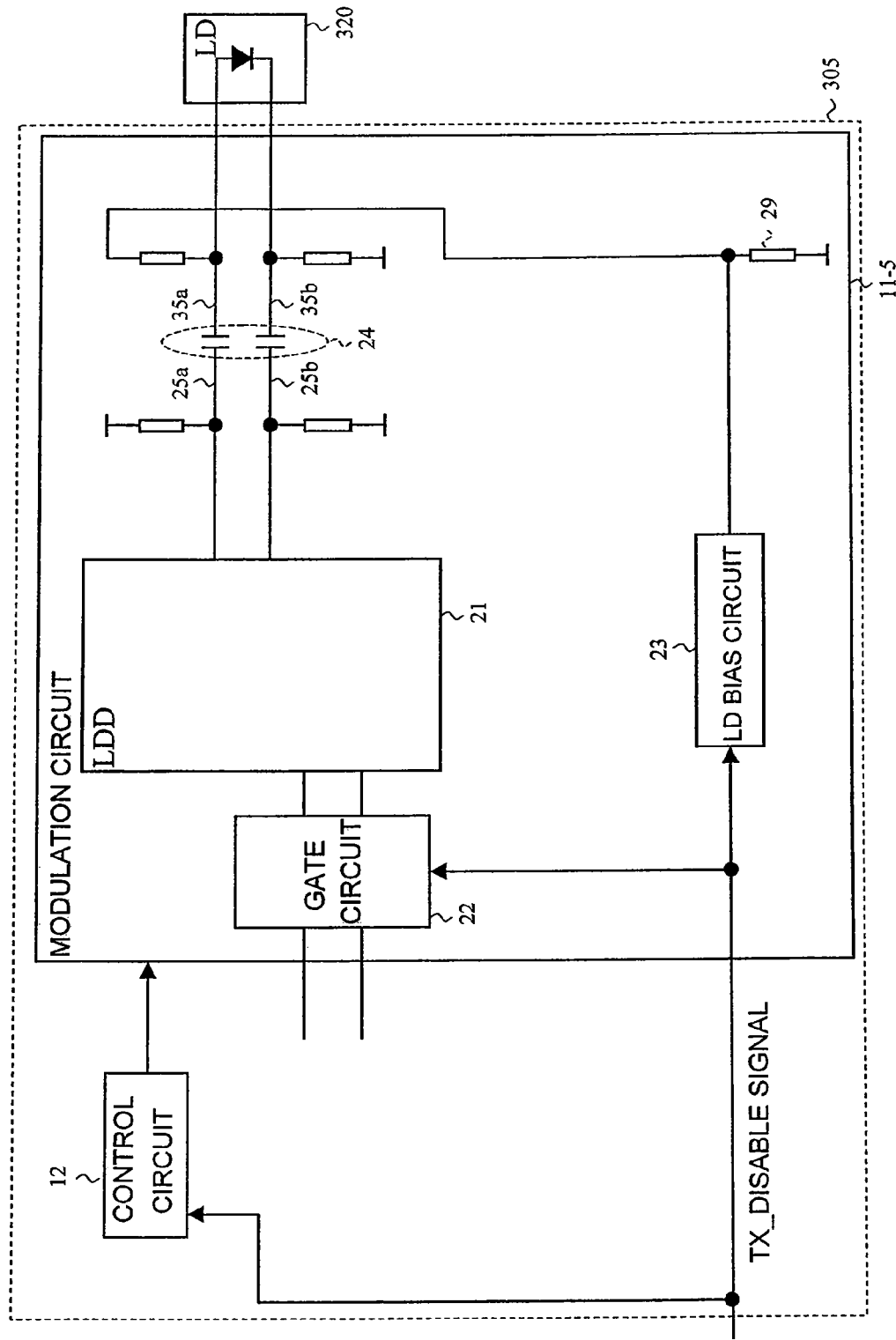
FIG. 13 is a block diagram explaining a configuration of an optical transmitter according to the invention.

FIG. 13 illustrates a block diagram explaining a configuration of an optical transmitter according to a fifth embodiment. The optical transmitter of FIG. 13 differs from the optical transmitter of FIG. 7 in that the optical transmitter of FIG. 13 includes a modulation device 305 as an alternative to the modulation device 302. The modulation device 305 includes a modulation circuit 11-5. The modulation circuit 11-5 differs from the modulation circuit 11-2 of FIG. 7 in that the output of the LD bias circuit 23 and a leak current resistor 29 are connected to the normal phase input terminal 35a.

In the optical transmitter of FIG. 13, similarly to the optical transmitter of FIG. 7, the control circuit 12 sends the control signal to the modulation circuit 11-5 to control the modulation circuit 11-5 based on the Tx_enable signal or Tx_disable signal. The modulation method of the optical transmitter of FIG. 13 differs from that of the optical transmitter of FIG. 7 in the following point.

In the modulation method of the modulation device 305, the control circuit 12 controls the modulation circuit 11-5 such that the average potential at the normal phase input terminal 35a is raised with the same time constant as that in the transient state of the average potential at the reverse phase input terminal 35b, and such that the difference potential amount in which the amplitude voltage of the modulation signal is subtracted from the difference between the average potential at the normal phase input terminal 35a and the average potential at the reverse phase input terminal 35b after the transient state is previously changed in the average potential at the normal phase input terminal 35a before the average potential at the normal phase input terminal 35a and the average potential at the reverse phase input terminal 35b fluctuate.

Figure 12:
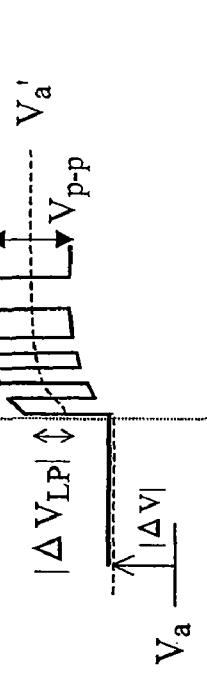
FIG. 12 is a view illustrating a potential state at each terminal in a modulation device of an optical transmitter according to the invention.

FIG. 12 illustrates a potential state at each terminal in a modulation device of the fifth embodiment. The potential fluctuation at each terminal is indicated by the solid line and the average potential is indicated by the broken line.

At the normal phase output terminal 25a, it is assumed that the potential $V_{low}$ is retained during the Tx_disable while the modulation signal having amplitude $V_{p-p}$ is output during the Tx_enable. The average potential fluctuation $|\Delta V_{DP}|$ becomes $V_{p-p}/2$ in the change in state from the Tx_disable to the Tx_enable. On the other hand, at the reverse phase output terminal 25b, it is assumed that the potential $V_{high}$ is retained during the Tx_disable while the modulation signal having the amplitude $V_{p-p}$ is output during the Tx_enable. The average potential fluctuation $|\Delta V_{DN}|$ becomes $V_{p-p}/2$ in the change in state from the Tx_disable to the Tx_enable.

At this point, at the reverse phase input terminal 35b, the potential Va is retained during the Tx_disable, and the modulation signal having the amplitude $V_{p-p}$ is input during the Tx_enable. Because the LDD and the LD are capacitively coupled in the change in state from the Tx_disable to the Tx_enable, after the average potential declines to $V_{p-p}/2$, the average potential rises to Va with a certain time constant, and the modulation signal having the average potential Va and the amplitude $V_{p-p}$ is then input to the LD. At this point, the fluctuation potential amount $|\Delta V_{LN}|$ of the transient response is $V_{p-p}/2$ that is equal to $|\Delta V_{DN}|$.

At the normal phase input terminal 35a, the potential Va+|ΔV| is retained during the Tx_disable, and the average potential is raised to Va' so as to pass the bias current through the LD at the same time as the modulation signal having the amplitude $V_{p-p}$ is input during the Tx_enable. At this point, a resistance value of the added resistor is adjusted such that |ΔV| becomes equal to Va'−Va−$V_{p-p}$ by the passage of the leak current through the LD. Because the LDD and the LD are capacitively coupled in the change in state from the Tx_disable to the Tx_enable, the average potential rises to $V_{p-p}/2$, and further rises to Va' with the same time constant as that of the reverse phase input terminal 35b so as to pass the bias current, and the modulation signal having the average potential Va' and the amplitude $V_{p-p}$ is then input to the LD. When the need to adjust the time constant at the normal phase input terminal 35a arises, similarly to the first embodiment, the time constant at the normal phase input terminal 35a is adjusted to the same time constant as that at the reverse phase input terminal 35b by providing the integration circuit 27. At this point, the fluctuation potential amount $|\Delta V_{LP}|$ of the transient response becomes $V_{p-p}/2$ that is equal to $|\Delta V_{LN}|$.

Accordingly, when the modulation is performed by the technique of the fifth embodiment, the optical transmitting signal is output from the LD while the waveform is stabilized, because the normal phase input terminal 35a and the reverse phase input terminal 35b are equal to each other in the average potential fluctuation and time constant in the transient response state even if the LDD and the LD are capacitively coupled.

Figure 25:
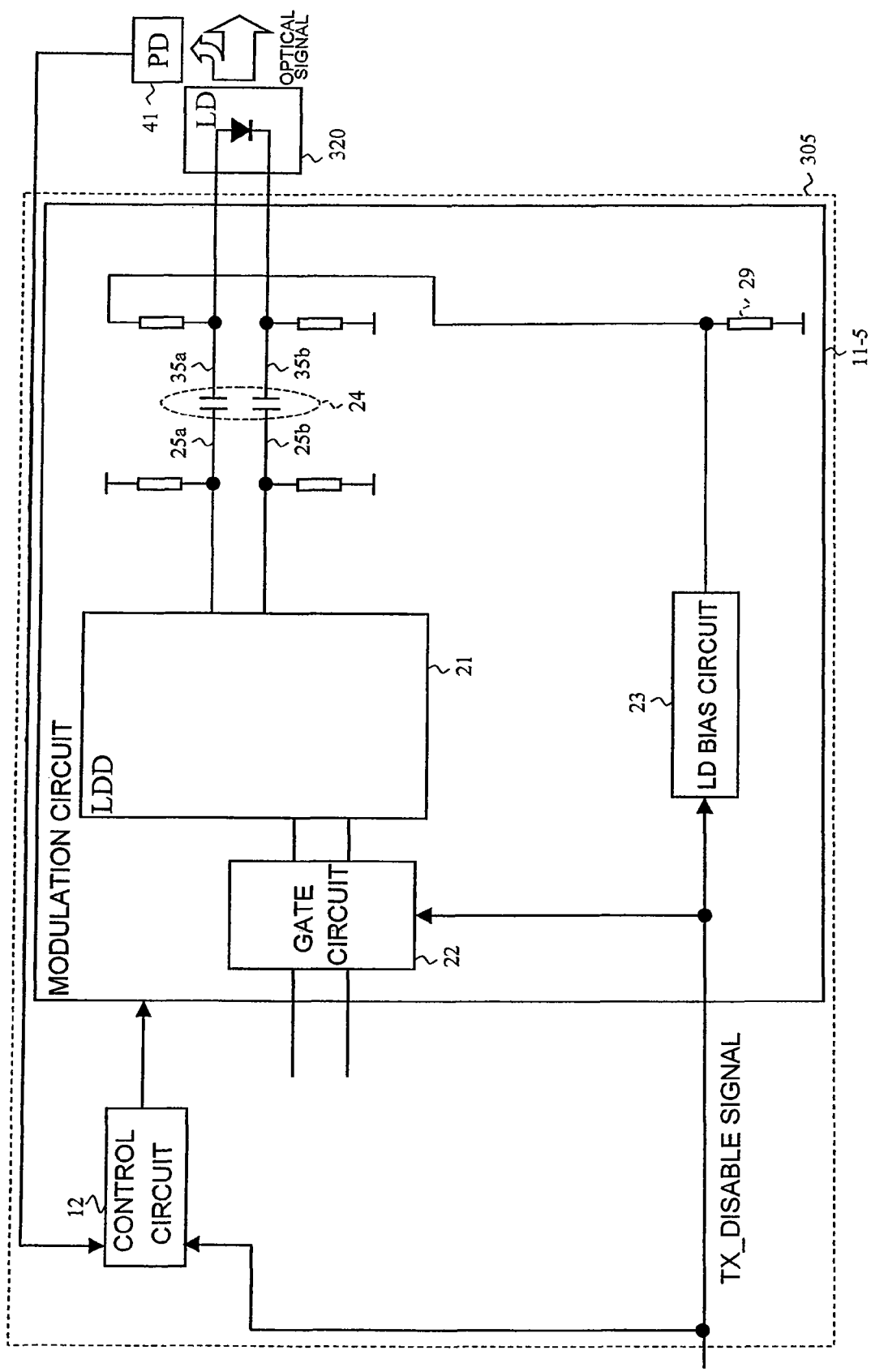
FIG. 25 is a block diagram explaining a configuration of an optical transmitter according to the invention.

FIG. 25 illustrates a block diagram of the modulation device 305 to which the configuration for performing the feedback control described in FIG. 17 is added. The modulation device 305 can stably output the optical signal by performing the feedback control, even if the optimum bias current fluctuates due to the temperature fluctuation or aging. The feedback control may be performed only for the time to be able to transmit the optical signal. The optical power is monitored only during the Tx_enable while the optical power is not monitored during the Tx_disable, so that the modulation device 305 can maintain the already-set value of the average potential at each of the terminals (25a, 25b, 35a, and 35b) in order to compensate the bias fluctuation caused by the temperature or aging. Therefore, even for the long frame interval of the transmitted frame compared with the time constant of the circuit that performs the feedback control, the modulation device 305 can shorten the time to stabilize the optical output in the change in state from the Tx_disable to the Tx_enable.

Figure 26:
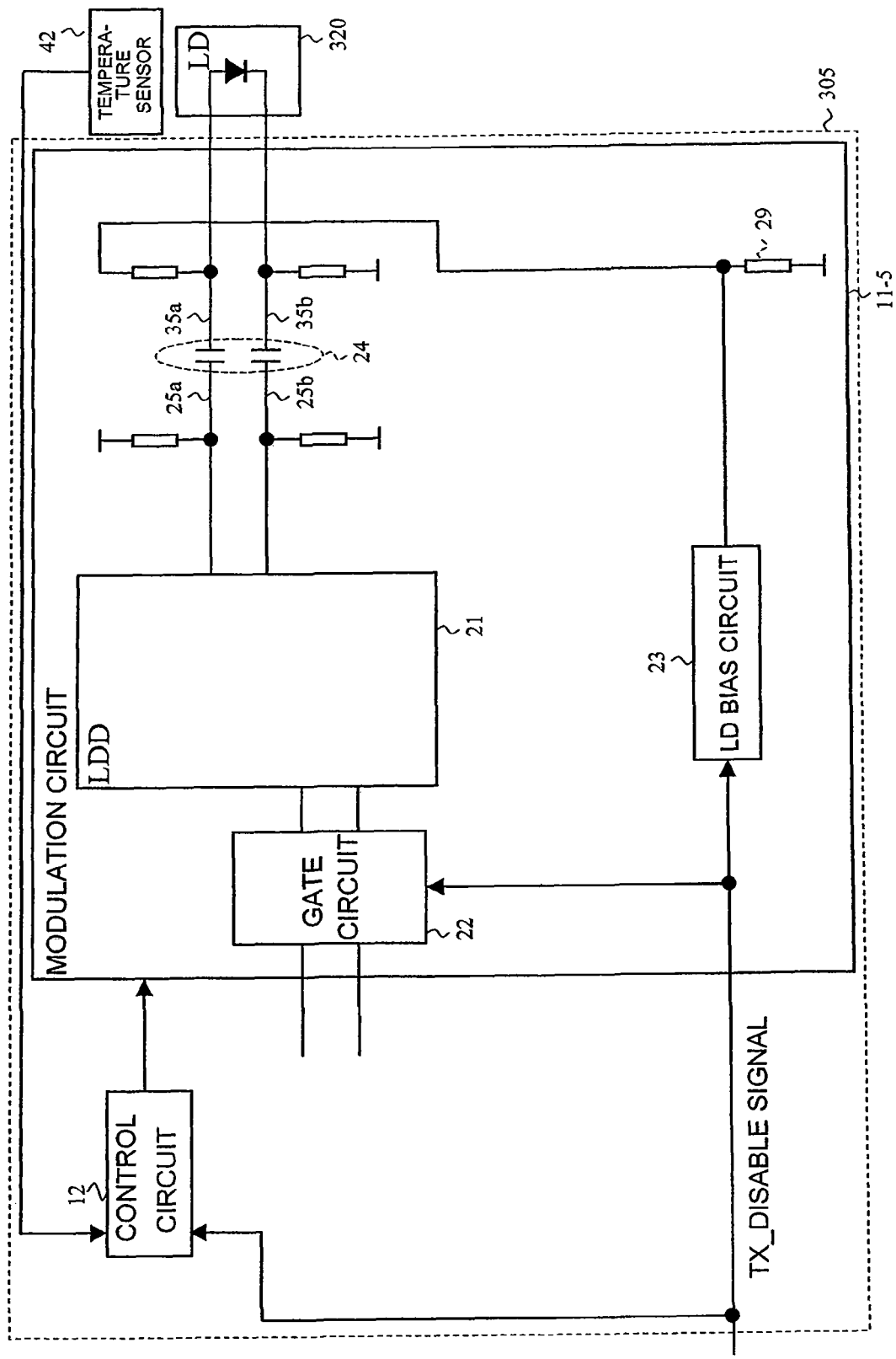
FIG. 26 is a block diagram explaining a configuration of an optical transmitter according to the invention.

FIG. 26 illustrates a block diagram of the modulation device 305 to which the configuration for performing the feedforward control described in FIG. 18 is added. The modulation device 305 can stably output the optical signal by performing the feedforward control, even if the optimum bias current fluctuates due to the temperature fluctuation.

The configurations for performing the feedback control and feedforward control described in FIGS. 25 and 26 can be loaded in a combined manner into the modulation device 305.

Sixth Embodiment

Figure 15:
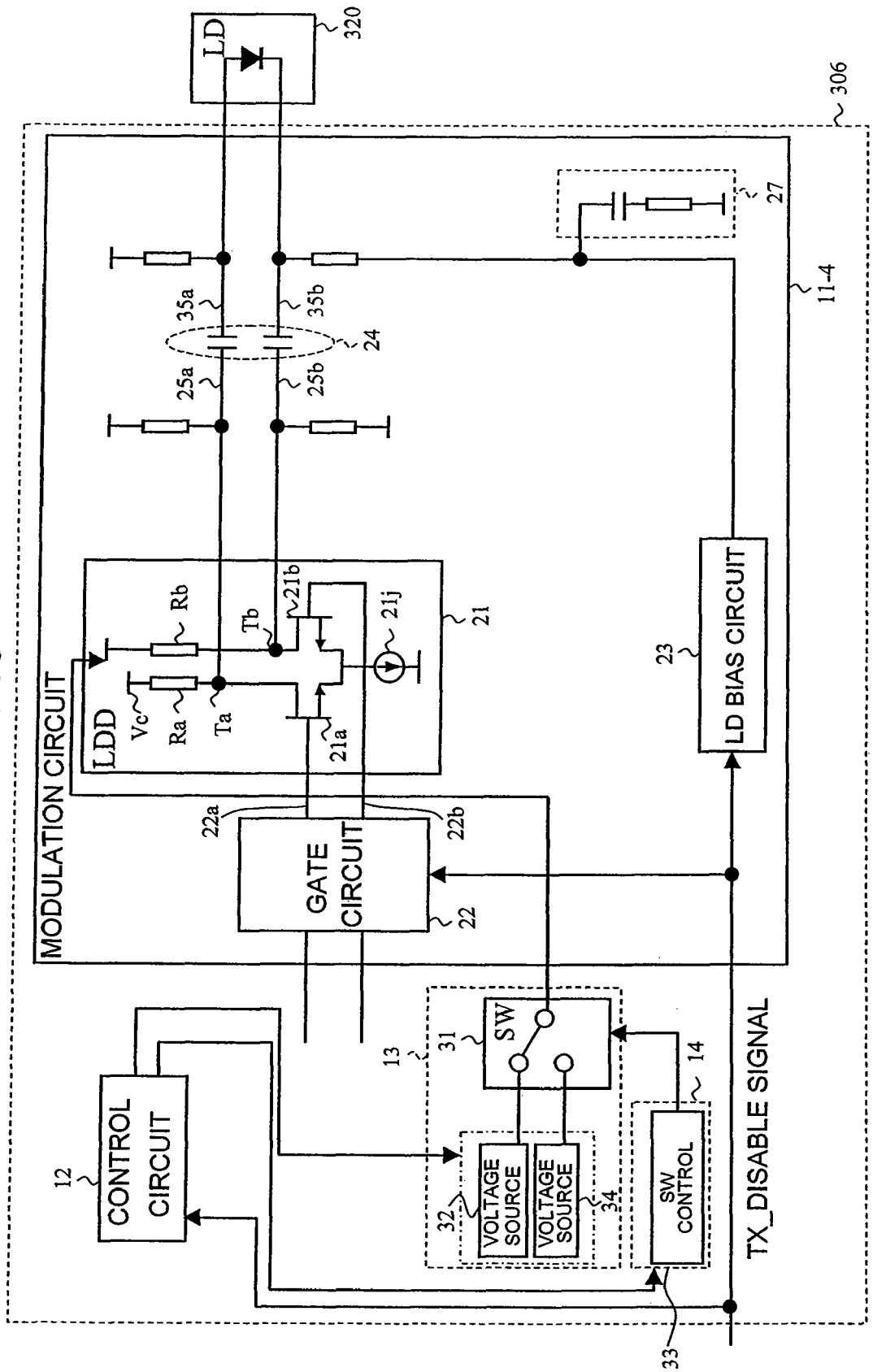
FIG. 15 is a block diagram explaining a configuration of an optical transmitter according to the invention.

FIG. 15 illustrates a block diagram explaining a configuration of an optical transmitter according to a sixth embodiment. The optical transmitter of FIG. 15 differs from the optical transmitter of FIG. 9 in that the optical transmitter of FIG. 15 includes a modulation device 306 as an alternative to the modulation device 303. The modulation device 306 differs from the modulation device 303 of FIG. 9 in that the modulation device 306 includes a modulation circuit 11-4 as an alternative to a modulation circuit 11-1. The modulation device 306 differs from the modulation device 303 of FIG. 9 in that the SW 31 is connected to not the current source circuit 21j of the LDD 21 but the power supply terminal side of the reverse phase output terminal 25b of the differential pair. The retention potential can be raised by $V_{high}$+|ΔV| by providing the high potential to the reverse phase output terminal 25b during the Tx_disable.

Although the optical transmitter of FIG. 15 modulates the input signal similarly to the optical transmitter of FIG. 9, the modulation method of the optical transmitter of FIG. 15 differs from that of the optical transmitter of FIG. 9 in the following point.

In the modulation method of the modulation device 306, the control circuit 12 controls the modulation circuit 11-4 such that the average potential at the normal phase input terminal 35a is raised with the same time constant as that in the transient state of the average potential at the reverse phase input terminal 35b, and such that the difference potential amount in which the amplitude voltage of the modulation signal is subtracted from the difference between the average potential at the normal phase input terminal 35a and the average potential at the reverse phase input terminal 35b after the transient state is previously changed in the average potential at the reverse phase output terminal 25b before the average potential at the normal phase input terminal 35a and the average potential at the reverse phase input terminal 35b fluctuate.

Figure 14:
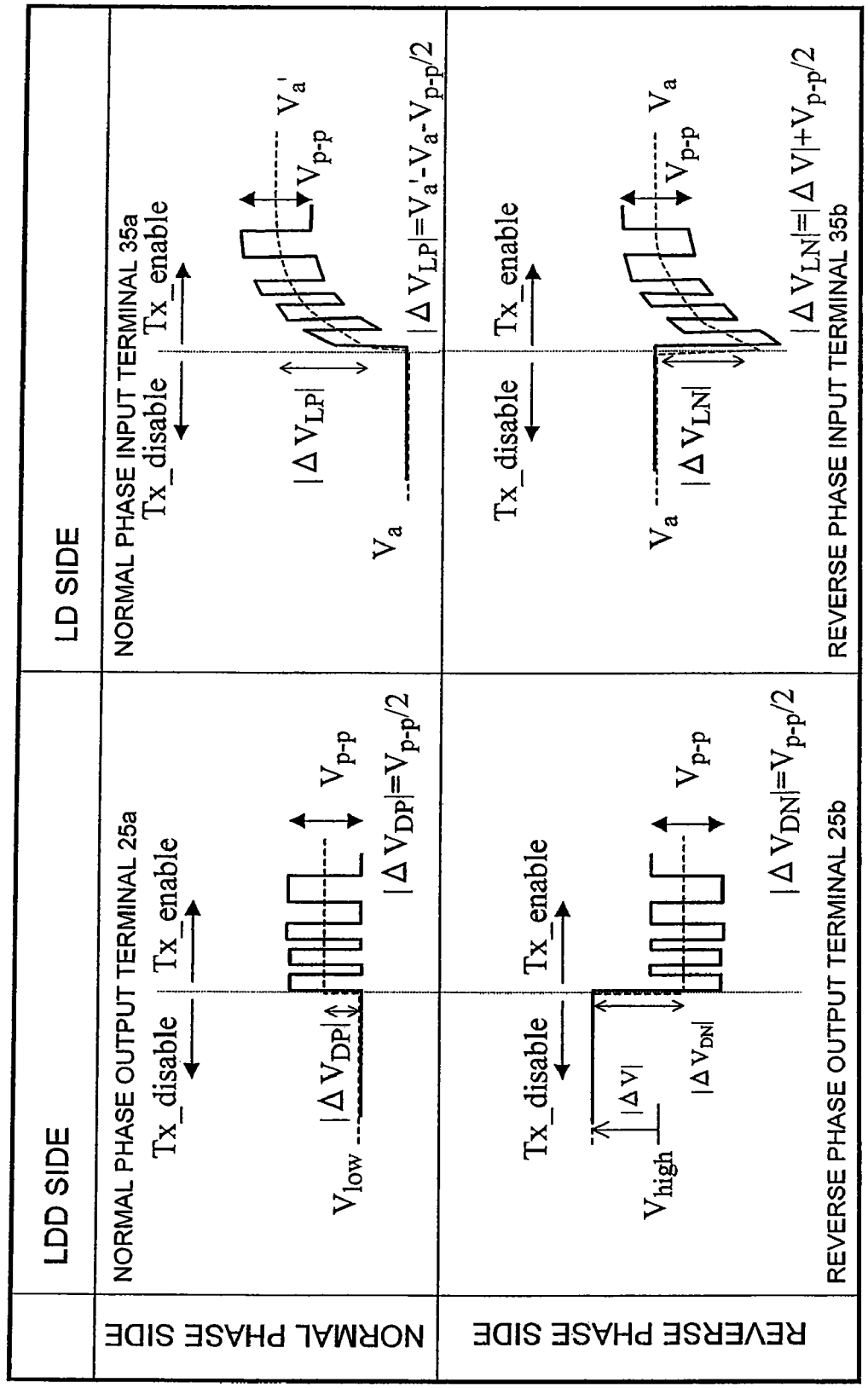
FIG. 14 is a view illustrating a potential state at each terminal in a modulation device of an optical transmitter according to the invention.

FIG. 14 illustrates a potential state at each terminal in the modulation device of the sixth embodiment. The potential fluctuation at each terminal is indicated by the solid line and the average potential is indicated by the broken line.

At the normal phase output terminal 25a, it is assumed that the potential $V_{low}$ is retained during the Tx_disable while the modulation signal having amplitude $V_{p-p}$ is output during the Tx_enable. The average potential fluctuation $|\Delta V_{DP}|$ becomes $V_{p-p}/2$ in the change in state from the Tx_disable to the Tx_enable. On the other hand, at the reverse phase output terminal 25b, it is assumed that the potential $V_{high}$+|ΔV| is retained during the Tx_disable while the potential is lowered to $V_{high}$ to output the modulation signal having the amplitude $V_{p-p}$ during the Tx_enable. The SW control unit controls the SW onto the side of the voltage source 32 that provides the high potential during the Tx_disable and controls the SW onto the side of the voltage source 34 that provides the low potential during the Tx_enable. During the Tx_disable, the potential at the reverse phase output terminal 25b is raised by |ΔV|=Va'−Va−$V_{p-p}$ with respect to the potential $V_{high}$ during the Tx_enable by connecting the SW to the voltage source 32.

The average potential fluctuation $|\Delta V_{DN}|$ becomes $|\Delta V|+V_{p-p}/2$ in the change in state from the Tx_disable to the Tx_enable.

At this point, at the reverse phase input terminal 35b, the potential Va is retained during the Tx_disable, and the modulation signal having the amplitude $V_{p-p}$ is input during the Tx_enable. Because the LDD and the LD are capacitively coupled in the change in state from the Tx_disable to the Tx_enable, after the average potential declines to $|\Delta V|+V_{p-p}/2$, the average potential rises to Va with a certain time constant, and the modulation signal having the average potential Va and the amplitude $V_{p-p}$ is then input to the LD. At this point, the fluctuation potential amount $|\Delta V_{LN}|$ of the transient response is $|\Delta V|+V_{p-p}/2=Va'-Va-V_{p-p}/2$ that is equal to $|\Delta V_{DN}|$.

At the normal phase input terminal 35a, the potential Va is retained during the Tx_disable, and the average potential is raised to Va' so as to pass the bias current through the LD at the same time as the modulation signal having the amplitude $V_{p-p}$ is input during the Tx_enable. Because the LDD and the LD are capacitively coupled in the change in state from the Tx_disable to the Tx_enable, after the average potential rises to $V_{p-p}/2$, the average potential further rises to Va' with the same time constant as that at the reverse phase input terminal 35b so as to pass the bias current, and the modulation signal having the average potential Va' and the amplitude $V_{p-p}$ is then input to the LD. When the need to adjust the time constant at the normal phase input terminal 35a arises, similarly to the first embodiment, the time constant at the normal phase input terminal 35a is adjusted to the same time constant as that at the reverse phase input terminal 35b by providing the integration circuit 27. At this point, the fluctuation potential amount $|\Delta V_{LP}|$ of the transient response becomes $Va'-Va-V_{p-p}/2$ that is equal to $|\Delta V_{LN}|$.

Accordingly, when the modulation is performed by the technique of the sixth embodiment, the optical transmitting signal is output from the LD while the waveform is stabilized, because the normal phase input terminal 35a and the reverse phase input terminal 35b are equal to each other in the average potential fluctuation and time constant in the transient response state even if the LDD and the LD are capacitively coupled.

In the sixth embodiment, during the Tx_disable, the potential at the reverse phase output terminal 25b is adjusted using the voltage controller and the voltage source circuit including the switch and the two voltage sources. Alternatively, the variable current source circuit that can adjust the potential in the above-described manner may be used as the current source of the LDD circuit. The pair of the normal phase output terminal 25a and the reverse phase output terminal 25b may be formed as the Darlington connection type differential pair.

Figure 27:
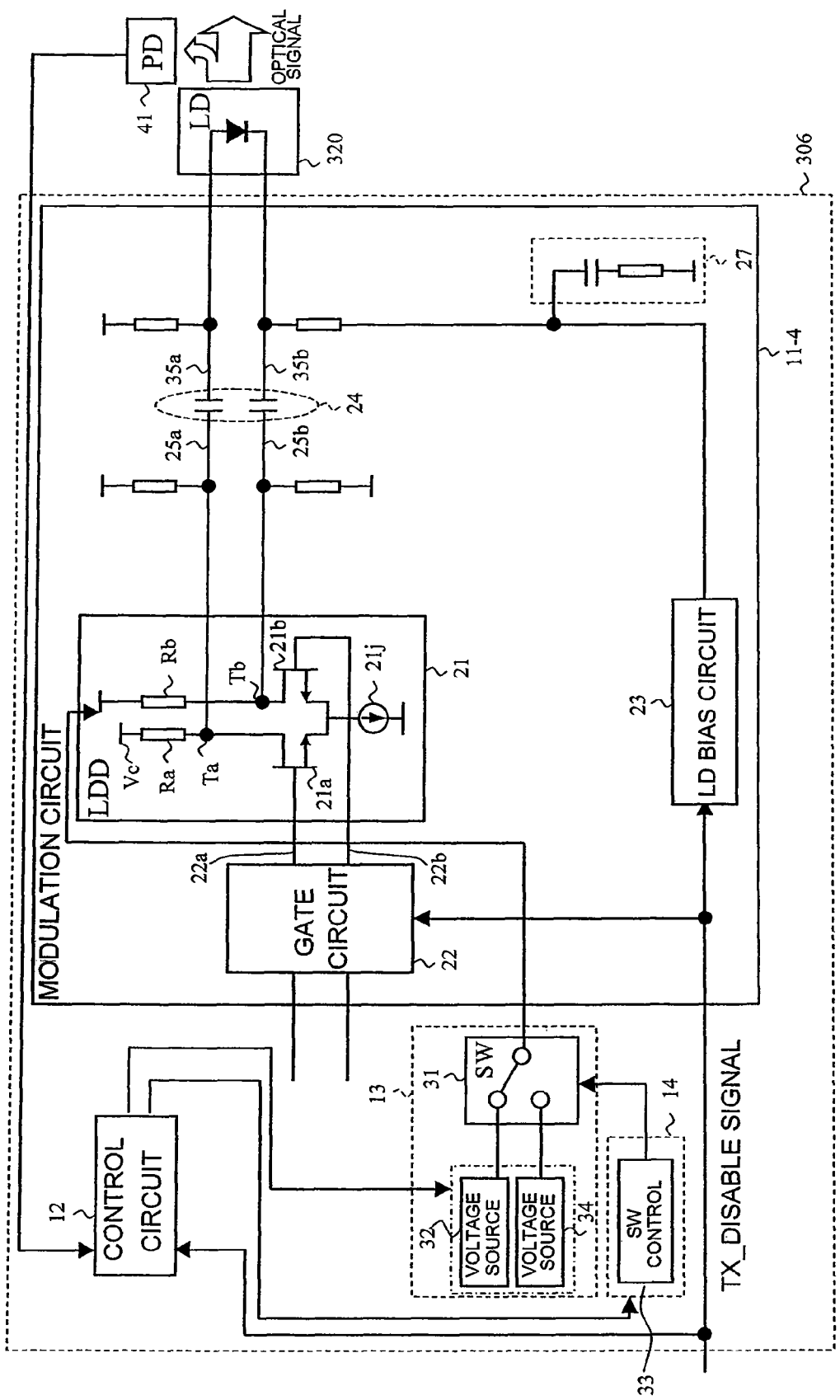
FIG. 27 is a block diagram explaining a configuration of an optical transmitter according to the invention.

FIG. 27 illustrates a block diagram of the modulation device 306 to which the configuration for performing the feedback control described in FIG. 17 is added. The modulation device 306 can stably output the optical signal by performing the feedback control, even if the optimum bias current fluctuates due to the temperature fluctuation or aging. The feedback control may be performed only for the time to be able to transmit the optical signal. The optical power is monitored only during the Tx_enable while the optical power is not monitored during the Tx_disable, so that the modulation device 306 can maintain the already-set value of the average potential at each of the terminals (25a, 25b, 35a, and 35b) in order to compensate the bias fluctuation caused by the temperature or aging. Therefore, even for the long frame interval of the transmitted frame compared with the time constant of the circuit that performs the feedback control, the modulation device 306 can shorten the time to stabilize the optical output in the change in state from the Tx_disable to the Tx_enable.

Figure 28:
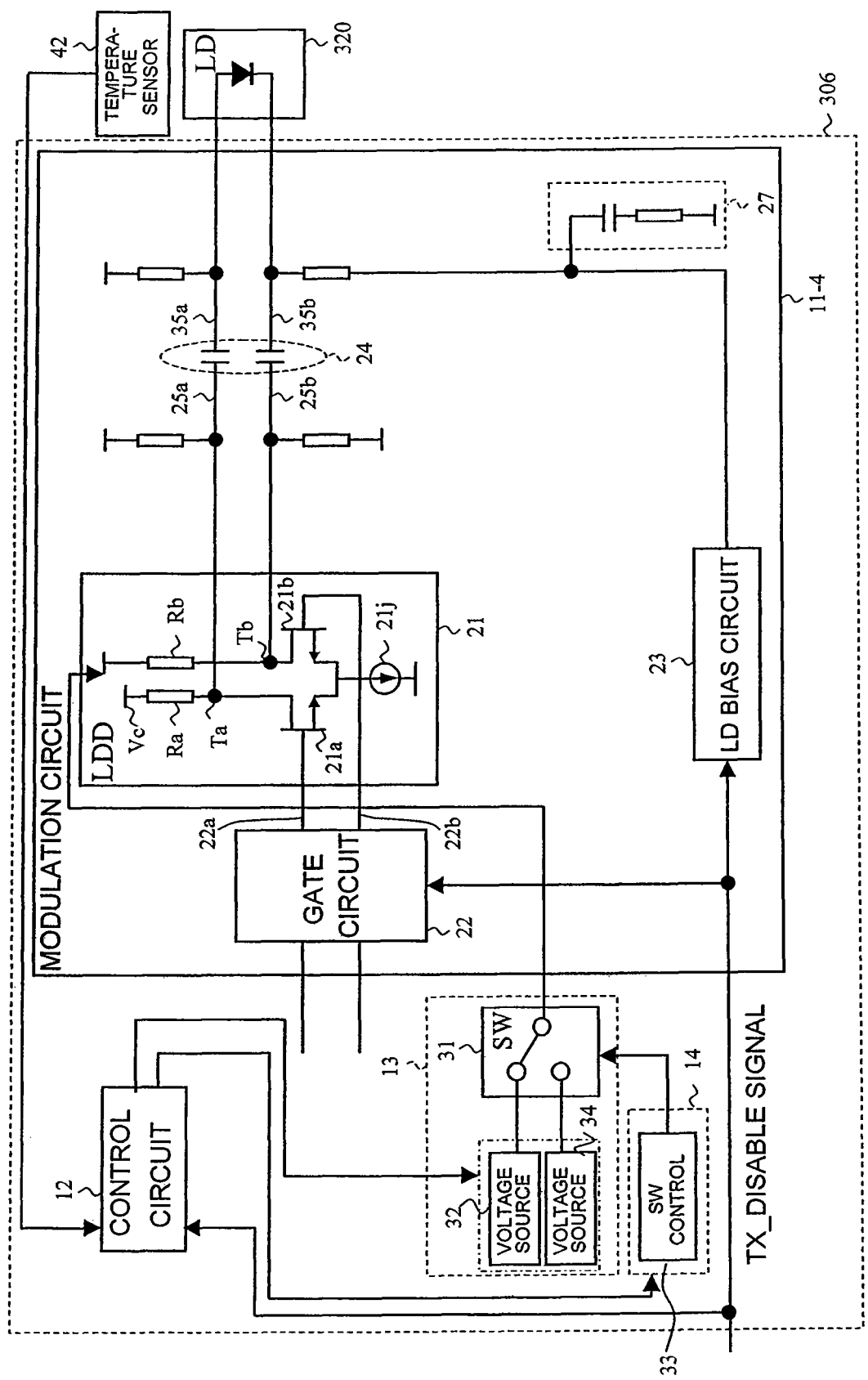
FIG. 28 is a block diagram explaining a configuration of an optical transmitter according to the invention.

FIG. 28 illustrates a block diagram of the modulation device 306 to which the configuration for performing the feedforward control described in FIG. 18 is added. The modulation device 306 can stably output the optical signal by performing the feedforward control, even if the optimum bias current fluctuates due to the temperature fluctuation.

The configurations for performing the feedback control and feedforward control described in FIGS. 27 and 28 can be loaded in a combined manner into the modulation device 306.

Other Embodiments

In the first to sixth embodiments, even if the transient potential fluctuation occurs in the LDD 21 by the rapid potential fluctuation generated in the LD 320, the correction is performed such that the potential fluctuations at the normal phase input terminal 35a and reverse phase input terminal 35b cancel each other, so that the optical signal can stably be transmitted. Although the direct modulation LD is used as the LD 320 in the first to sixth embodiments, the modulation can be performed by the similar modulation method when a light source and an external optical modulator are used.

(Modulation Program and Recording Medium in which Modulation Program is Stored)

The modulation device of the optical modulator of the embodiments can be realized in such a manner that a computer executes a modulation program. For example, the modulation program is provided while stored in a recording medium. Examples of the recording medium include recording mediums such as a flexible disk, a CD-ROM, and a DVD and a semiconductor memory. A database storage program and a database search program may be provided through a LAN (Local Area Network) or the Internet.

Figure 16:
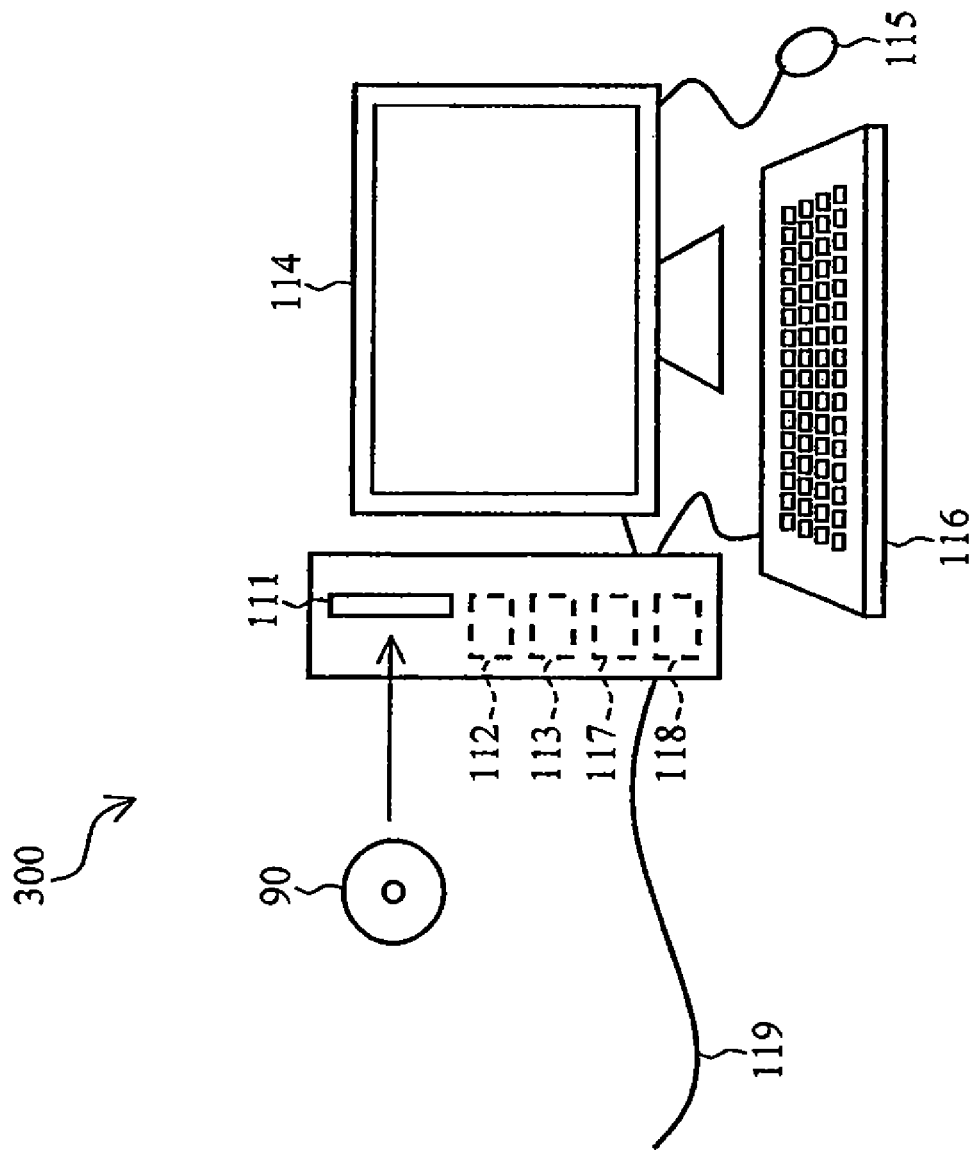
FIG. 16 is a view illustrating an example of a computer that executes a modulation program recorded in a recording medium.

FIG. 16 is a view illustrating an example of a computer 300 that executes the modulation program recorded in a storage medium 90. The computer 300 includes a storage medium reading device 111 that reads the storage medium 90 such as the flexible disk, the CD-ROM, and the DVD, a work memory (RAM) 112, a memory 113 in which the program stored in the recording medium 90 is stored, a display 114, a mouse 115 and a keyboard 116 that are input devices, a CPU 117 that controls the execution of the program, a hard disk 118 in which data is stored, and a cable 119. In FIG. 16, the work memory 112, the memory 113, the CPU 117, and the hard disk 118 are indicated by the broken line because the units are incorporated in the case.

In the computer 300, when the recording medium 90 is inserted in the storage medium reading device 111, the modulation program stored in the recording medium 90 is installed from the storage medium reading device 111 onto the memory 113. The CPU 117 can access the modulation program after the modulation program is installed on the memory 113, and the computer 300 can be operated as the control circuit of the modulation device in the optical modulator of the embodiments by the modulation program.

When the computer 300 is operated as the control circuit 12 of the optical transmitter in FIG. 5, because the computer 300 is connected to the modulation circuit 11-1 through the cable 119, and computes the average potentials at the terminals from the pieces of data of the potential fluctuations at the normal phase output terminal 25a, reverse phase output terminal 25b, normal phase input terminal 35a, and reverse phase input terminal 35b, of which the modulation circuit 11-1 notifies the computer 300, using the CPU 117, the memory 113, and the work memory 112, thereby confirming the fluctuation amount at each terminal. When the rapid average potential fluctuation is generated at one of the terminals, as described in the first to sixth embodiments, the transient states of the average potentials at the normal phase input terminal 35a and reverse phase input terminal 35b are equalized, and the average potentials at the normal phase input terminal 35a and reverse phase input terminal 35b are controlled so as to be able to cancel each other as the in-phase components of the signal input to the light source.

At this point, the computer 300 is not limited to the personal computer of FIG. 16. For example, the computer 300 includes a DVD player, a game machine, and a cellular telephone, which includes the storage medium reading device 111 and the CPU 117 to perform the processing and control using the software.

INDUSTRIAL APPLICABILITY

The optical transmitter can be applied to a public communication network, a dedicated network, a LAN, and the like as long as the optical transmitter modulates the electric signal into the optical signal.

The invention claimed is:

1. A modulation method in a modulation device including a modulation circuit that passes a bias current through a modulation target that is a direct modulation laser or an external optical modulator, the modulation target being capacitively coupled to the modulation circuit, the modulation circuit driving the modulation target with a differential electric signal including a normal phase and a reverse phase; and a control circuit that sends a control signal to the modulation circuit to control the modulation circuit based on a signal providing an instruction to permit or prohibit transmission, wherein, when fluctuations in average potentials at a normal phase input terminal and a reverse phase input terminal of the modulation target are generated, the control circuit causes the modulation circuit to control at least one of average potentials at the normal phase input terminal and the reverse phase input terminal and the normal phase output terminal and the reverse phase output terminal of the modulation circuit such that transient states of the average potentials generated before and after average potential fluctuation become identical to each other, and the transient state of the average potential at the normal phase input terminal and the transient state of the average potential at the reverse phase input terminal cancel each other as in-phase components of the differential electric signal.

2. The modulation method according to claim 1, wherein the control circuit controls the modulation circuit such that the average potential at the reverse phase input terminal is lowered by an amplitude voltage of a modulation signal with a time constant that is identical to a time constant in the transient state of the average potential at the normal phase input terminal.

3. The modulation method according to claim 1, wherein the control circuit controls the modulation circuit, such that the average potential at the reverse phase input terminal is lowered with a time constant that is identical to a time constant in the transient state of the average potential at the normal phase input terminal, and such that a difference potential amount, in which an amplitude voltage of a modulation signal is subtracted from a difference between the average potential at the normal phase input terminal and the average potential at the reverse phase input terminal after the transient state, is previously changed in the average potential at the reverse phase input terminal before the average potential at the normal phase input terminal and the average potential at the reverse phase input terminal fluctuate.

4. The modulation method according to claim 1, wherein the control circuit controls the modulation circuit, such that the average potential at the reverse phase input terminal is lowered with a time constant that is identical to a time constant in the transient state of the average potential at the normal phase input terminal, and such that a difference potential amount, in which an amplitude voltage of a modulation signal is subtracted from a difference between the average potential at the normal phase input terminal and the average potential at the reverse phase input terminal after the transient state, is previously changed in the average potential at the normal phase output terminal before the average potential at the normal phase input terminal and the average potential at the reverse phase input terminal fluctuate.

5. The modulation method according to claim 1, wherein the control circuit controls the modulation circuit such that the average potential at the normal phase input terminal is raised by an amplitude voltage of a modulation signal with a time constant that is identical to a time constant in the transient state of the average potential at the reverse phase input terminal.

6. The modulation method according to claim 1, wherein the control circuit controls the modulation circuit, such that the average potential at the normal phase input terminal is raised with a time constant that is identical to a time constant in the transient state of the average potential at the reverse phase input terminal, and such that a difference potential amount, in which an amplitude voltage of a modulation signal is subtracted from a difference between the average potential at the normal phase input terminal and the average potential at the reverse phase input terminal after the transient state, is previously changed in the average potential at the normal phase input terminal before the average potential at the normal phase input terminal and the average potential at the reverse phase input terminal fluctuate.

7. The modulation method according to claim 1, wherein the control circuit controls the modulation circuit, such that the average potential at the normal phase input terminal is raised with a time constant that is identical to a time constant in the transient state of the average potential at the reverse phase input terminal, and such that a difference potential amount, in which an amplitude voltage of a modulation signal is subtracted from a difference between the average potential at the normal phase input terminal and the average potential at the reverse phase input terminal after the transient state, is previously changed in the average potential at the reverse phase output terminal before the average potential at the normal phase input terminal and the average potential at the reverse phase input terminal fluctuate.

8. The modulation method as in claim 1, wherein optical power of an optical signal output from the modulation target is measured, and feedback control adjusting at least one of the average potentials at the normal phase input terminal and the reverse phase input terminal and the normal phase output terminal and the reverse phase output terminal of the modulation circuit is performed such that the optical power becomes a predetermined value.

9. The modulation method according to claim 8, wherein the feedback control is performed only in a signal providing an instruction to permit the transmission in the signal providing the instruction to permit or prohibit the transmission.

10. The modulation method as in claim 1, wherein a temperature of the modulation target is measured, and feedforward control adjusting at least one of the average potentials at the normal phase input terminal and the reverse phase input terminal and the normal phase output terminal and the reverse phase output terminal of the modulation circuit is performed such that intensity of the optical signal output from the modulation target becomes a predetermined value even if the temperature of the modulation target fluctuates.

11. A modulation program that causes to a computer to perform the modulation method as in any one of claims 1 to 10.

12. A computer-readable recording medium in which the modulation program according to claim 11 is recorded.

13. A modulation device comprising:
a modulation circuit that passes a bias current through a modulation target that is a direct modulation laser or an external optical modulator, the modulation target being capacitively coupled to the modulation circuit, the modulation circuit driving the modulation target with a differential electric signal including a normal phase and a reverse phase; and a control circuit that sends a control signal to the modulation circuit to control the modulation circuit based on a signal providing an instruction to permit or prohibit transmission,
wherein the control circuit causes the modulation circuit to control at least one of average potentials at a normal phase input terminal and a reverse phase input terminal of the modulation target and average potentials at a normal phase output terminal and a reverse phase output terminal of the modulation circuit by the modulation method as in claim 1.

14. A modulation device comprising:
a modulation circuit that passes a bias current through a modulation target that is a direct modulation laser or an external optical modulator, the modulation target being capacitively coupled to the modulation circuit, the modulation circuit driving the modulation target with a differential electric signal including a normal phase and a reverse phase; a control circuit that sends a control signal to the modulation circuit to control the modulation circuit based on a signal providing an instruction to permit or prohibit transmission; a current source circuit that is connected to a normal phase output terminal and a reverse phase output terminal of the modulation circuit; and a current controller that controls a current value of the current source circuit,
wherein the control circuit causes the modulation circuit to control at least one of average potentials at a normal phase input terminal and a reverse phase input terminal of the modulation target and average potentials at the normal phase output terminal and the reverse phase output terminal of the modulation circuit by the modulation method according to claim 4, and
the control circuit causes the current controller to control the current value of the current source circuit such that the average potential at the normal phase output terminal or the reverse phase output terminal is changed by the difference potential amount.

15. A modulation device comprising:
a modulation circuit that passes a bias current through a modulation target that is a direct modulation laser or an external optical modulator, the modulation target being capacitively coupled to the modulation circuit, the modulation circuit driving the modulation target with a differential electric signal including a normal phase and a reverse phase; a control circuit that sends a control signal to the modulation circuit to control the modulation circuit based on a signal providing an instruction to permit or prohibit transmission; a current source circuit that is connected to a normal phase output terminal and a reverse phase output terminal of the modulation circuit; and a current controller that controls a current value of the current source circuit,
wherein the control circuit causes the modulation circuit to control at least one of average potentials at a normal phase input terminal and a reverse phase input terminal of the modulation target and average potentials at the normal phase output terminal and the reverse phase output terminal of the modulation circuit by the modulation method according to claim 7, and
the control circuit causes the current controller to control the current value of the current source circuit such that the average potential at the normal phase output terminal or the reverse phase output terminal is changed by the difference potential amount.

16. A modulation device comprising:
a modulation circuit that passes a bias current through a modulation target that is a direct modulation laser or an external optical modulator, the modulation target being capacitively coupled to the modulation circuit, the modulation circuit driving the modulation target with a differential electric signal including a normal phase and a reverse phase; a control circuit that sends a control signal to the modulation circuit to control the modulation circuit based on a signal providing an instruction to permit or prohibit transmission; a voltage source circuit that is connected between a ground and at least one of a normal phase output terminal and a reverse phase output terminal of the control circuit, and is a circuit in which two voltage sources and a switch are series-connected, the switch selecting one of the voltage sources; and a voltage controller that controls a voltage value of the voltage source circuit,
wherein the control circuit causes the modulation circuit to control at least one of average potentials at a normal phase input terminal and a reverse phase input terminal of the modulation target and average potentials at the normal phase output terminal and the reverse phase output terminal of the modulation circuit by the modulation method according to claim 4, and
the control circuit causes the voltage controller to control the voltage value of the voltage source circuit such that the average potential at the normal phase output terminal or the reverse phase output terminal is changed by the difference potential amount.

17. A modulation device comprising:
a modulation circuit that passes a bias current through a modulation target that is a direct modulation laser or an external optical modulator, the modulation target being capacitively coupled to the modulation circuit, the modulation circuit driving the modulation target with a differential electric signal including a normal phase and a reverse phase; a control circuit that sends a control signal to the modulation circuit to control the modulation circuit based on a signal providing an instruction to permit or prohibit transmission; a voltage source circuit that is connected between a ground and at least one of a normal phase output terminal and a reverse phase output terminal of the control circuit, and is a circuit in which two voltage sources and a switch are series-connected, the switch selecting one of the voltage sources; and a voltage controller that controls a voltage value of the voltage source circuit, wherein the control circuit causes the modulation circuit to control at least one of average potentials at a normal phase input terminal and a reverse phase input terminal of the modulation target and average potentials at the normal phase output terminal and the reverse phase output terminal of the modulation circuit by the modulation method according to claim 7, and the control circuit causes the voltage controller to control the voltage value of the voltage source circuit such that the average potential at the normal phase output terminal or the reverse phase output terminal is changed by the difference potential amount.

18. A modulation device comprising:

a modulation circuit that passes a bias current through a modulation target that is a direct modulation laser or an external optical modulator, the modulation target being capacitively coupled to the modulation circuit, the modulation circuit driving the modulation target with a differential electric signal including a normal phase and a reverse phase; a control circuit that sends a control signal to the modulation circuit to control the modulation circuit based on a signal providing an instruction to permit or prohibit transmission; a current source circuit that is connected to a normal phase output terminal and a reverse phase output terminal of the modulation circuit; and a current controller that controls a current value of the current source circuit, wherein the modulation circuit includes a Darlington connection type differential pair, pair of the normal phase output terminal and the reverse phase output terminal of the modulation circuit is the Darlington connection type differential pair, the control circuit causes the modulation circuit to control at least one of average potentials at a normal phase input terminal and a reverse phase input terminal of the modulation target and average potentials at the normal phase output terminal and the reverse phase output terminal of the modulation circuit by the modulation method according to claim 4, and the control circuit causes the current controller to control the current value of the current source circuit such that the average potential at the normal phase output terminal or the reverse phase output terminal is changed by the difference potential amount.

19. A modulation device comprising:

a modulation circuit that passes a bias current through a modulation target that is a direct modulation laser or an external optical modulator, the modulation target being capacitively coupled to the modulation circuit, the modulation circuit driving the modulation target with a differential electric signal including a normal phase and a reverse phase; a control circuit that sends a control signal to the modulation circuit to control the modulation circuit based on a signal providing an instruction to permit or prohibit transmission; a current source circuit that is connected to a normal phase output terminal and a reverse phase output terminal of the modulation circuit; and a current controller that controls a current value of the current source circuit, wherein the modulation circuit includes a Darlington connection type differential pair, pair of the normal phase output terminal and the reverse phase output terminal of the modulation circuit is the Darlington connection type differential pair, the control circuit causes the modulation circuit to control at least one of average potentials at a normal phase input terminal and a reverse phase input terminal of the modulation target and average potentials at the normal phase output terminal and the reverse phase output terminal of the modulation circuit by the modulation method according to claim 7, and the control circuit causes the current controller to control the current value of the current source circuit such that the average potential at the normal phase output terminal or the reverse phase output terminal is changed by the difference potential amount.

20. The modulation device as in claim 13, further comprising an integration circuit between at least one of the normal phase input terminal and the reverse phase input terminal and the LD bias circuit.

21. The modulation device as in claim 13, further comprising an optical monitor means for measuring optical power of an optical signal output from the modulation target, wherein the control circuit performs feedback control adjusting at least one of the average potentials at the normal phase input terminal and the reverse phase input terminal and the normal phase output terminal and the reverse phase output terminal of the modulation circuit such that the optical power measured by the optical monitor means becomes a predetermined value.

22. The modulation device according to claim 21, wherein the control circuit performs the feedback control only in a signal providing an instruction to permit the transmission in the signal providing the instruction to permit or prohibit the transmission.

23. The modulation device according to claim 18, wherein the optical monitor means is a photoreceiver that is disposed in a direction in which the modulation target outputs the optical signal.

24. The modulation device as in claim 13, further comprising a temperature sensor that measures a temperature of the modulation target, wherein the control circuit performs feedforward control adjusting at least one of the average potentials at the normal phase input terminal and the reverse phase input terminal and the normal phase output terminal and the reverse phase output terminal of the modulation circuit such that intensity of the optical signal output from the modulation target becomes a predetermined value even if the modulation target temperature measured by the temperature sensor fluctuates.

25. An optical transmitter comprising:

the modulation device as in any one of claims 13 to 14, and 15 to 24;

and the modulation target.

* * * * *